United States Patent
Sekito

(10) Patent No.: US 9,957,390 B2
(45) Date of Patent: May 1, 2018

(54) RESIN COMPOSITION FOR PIGMENT-CONTAINING INSULATING FILM, AND USE THEREOF

(71) Applicant: KANEKA CORPORATION, Osaka (JP)

(72) Inventor: Yoshihide Sekito, Shiga (JP)

(73) Assignee: KANEKA CORPORATION, Osaka (JP)

( * ) Notice: Subject to any disclaimer, the term of this patent is extended or adjusted under 35 U.S.C. 154(b) by 23 days.

(21) Appl. No.: 14/374,465

(22) PCT Filed: Dec. 19, 2012

(86) PCT No.: PCT/JP2012/082968
§ 371 (c)(1),
(2) Date: Jul. 24, 2014

(87) PCT Pub. No.: WO2013/111481
PCT Pub. Date: Aug. 1, 2013

(65) Prior Publication Data
US 2014/0370301 A1   Dec. 18, 2014

(30) Foreign Application Priority Data

Jan. 25, 2012 (JP) ................................. 2012-013340
Jan. 25, 2012 (JP) ................................. 2012-013341
(Continued)

(51) Int. Cl.
*C08L 75/04* (2006.01)
*H05K 3/28* (2006.01)
(Continued)

(52) U.S. Cl.
CPC .......... *C08L 75/04* (2013.01); *C08G 18/0823* (2013.01); *C08G 18/44* (2013.01);
(Continued)

(58) Field of Classification Search
CPC .... C08L 75/04; C08L 33/12; C08L 2205/025; C08L 2205/03; C08G 18/0823;
(Continued)

(56) References Cited

U.S. PATENT DOCUMENTS 4,238,385 A    12/1980 Okado et al.
8,784,956 B2 *  7/2014 Saitou et al. .............. 428/32.34
(Continued)

FOREIGN PATENT DOCUMENTS

CN    101278236    10/2008
CN    101845216    9/2010
(Continued)

OTHER PUBLICATIONS

International Search Report, PCT/JP2012/082968, dated Apr. 2, 2013.
(Continued)

*Primary Examiner* — Thao T Tran
(74) *Attorney, Agent, or Firm* — Kagan Binder, PLLC

(57) ABSTRACT

According to a resin composition for a pigment-containing insulating film which resin composition contains at least a (A) binder polymer and (B) pigment-containing cross-linked polymer particles, it is possible to provide a resin composition for a pigment-containing insulating film which resin composition is excellent in tack property after drying and allows a resultant pigment-containing insulating film to be excellent in flexibility and electrical insulation reliability and to be small in warpage after curing, a resin film for a pigment-containing insulating film, a pigment-containing insulating film, and a printed wiring board provided with a pigment-containing insulating film.

19 Claims, 1 Drawing Sheet

(30) Foreign Application Priority Data

| Apr. 10, 2012 | (JP) | 2012-089522 |
|---|---|---|
| Apr. 10, 2012 | (JP) | 2012-089523 |

(51) Int. Cl.

| B32B 27/40 | (2006.01) |
|---|---|
| C08J 5/18 | (2006.01) |
| C08G 18/48 | (2006.01) |
| C08G 18/66 | (2006.01) |
| C08G 18/75 | (2006.01) |
| C08G 18/79 | (2006.01) |
| C08G 18/08 | (2006.01) |
| C08G 18/44 | (2006.01) |

(52) U.S. Cl.
CPC ..... *C08G 18/4854* (2013.01); *C08G 18/6659* (2013.01); *C08G 18/758* (2013.01); *C08G 18/792* (2013.01); *C08J 5/18* (2013.01); *H05K 3/285* (2013.01); *C08J 2375/04* (2013.01); *C08L 2205/025* (2013.01); *C08L 2205/03* (2013.01); *H05K 2203/161* (2013.01); *Y10T 428/31551* (2015.04)

(58) Field of Classification Search
CPC ............................ C08G 18/44; C08G 18/4854; C08G 18/6659; C08G 18/758; C08G 18/792; C08J 2375/04; C08J 5/18; H05K 1/0298; H05K 2203/161; H05K 3/285; Y10T 428/31551
USPC ........ 428/423.1; 524/590, 507, 133; 522/71, 522/83; 525/50
See application file for complete search history.

(56) References Cited

U.S. PATENT DOCUMENTS

| 8,993,897 | B2* | 3/2015 | Sekito | 174/258 |
|---|---|---|---|---|
| 2003/0122371 | A1 | 7/2003 | Rochford et al. | |
| 2003/0176528 | A1 | 9/2003 | Tahara et al. | |
| 2004/0063815 | A1* | 4/2004 | Kinose | C01B 25/023 523/205 |
| 2004/0197524 | A1 | 10/2004 | Rochford et al. | |
| 2004/0232813 | A1 | 11/2004 | Nakano et al. | |
| 2005/0158088 | A1 | 7/2005 | Someya et al. | |
| 2006/0088349 | A1 | 4/2006 | Someya et al. | |
| 2008/0300350 | A1 | 12/2008 | Ohno et al. | |
| 2009/0008138 | A1* | 1/2009 | Uchida et al. | 174/256 |
| 2009/0065244 | A1 | 3/2009 | Kimura et al. | |
| 2009/0171015 | A1* | 7/2009 | Uchida | C08G 18/0823 524/590 |
| 2009/0312519 | A1 | 12/2009 | Uera et al. | |
| 2010/0041785 | A1 | 2/2010 | Ohashi et al. | |
| 2010/0196822 | A1 | 8/2010 | Sasaki et al. | |
| 2011/0083884 | A1 | 4/2011 | Okada et al. | |
| 2012/0083552 | A1* | 4/2012 | Ma | 523/436 |
| 2012/0138868 | A1* | 6/2012 | Arifuku | B82Y 10/00 252/510 |
| 2012/0183776 | A1* | 7/2012 | Arioka et al. | 428/403 |
| 2012/0250268 | A1* | 10/2012 | Ito | C08G 18/348 361/748 |
| 2013/0264099 | A1 | 10/2013 | Sekido et al. | |
| 2013/0337161 | A1* | 12/2013 | Akimoto et al. | 427/162 |

FOREIGN PATENT DOCUMENTS

| JP | 55-27647 | 2/1980 |
|---|---|---|
| JP | 09-136931 | 5/1997 |
| JP | 9-137109 | 5/1997 |
| JP | 2000-241969 | 9/2000 |
| JP | 2001-324801 | 11/2001 |
| JP | 2002-293882 | 10/2002 |
| JP | 2002-296776 | 10/2002 |
| JP | 2002-322221 | 11/2002 |
| JP | 2004-99635 | 4/2004 |
| JP | 2006-40935 | 2/2006 |
| JP | 2006-86196 | 3/2006 |
| JP | 2008-181750 | 8/2008 |
| JP | 2009-069664 | 4/2009 |
| JP | 2009-230076 | 10/2009 |
| JP | 2009-271445 | 11/2009 |
| JP | 2009271445 A * | 11/2009 |
| JP | 2010-48854 | 3/2010 |
| JP | 2010-117452 | 5/2010 |
| JP | 2010-139559 | 6/2010 |
| JP | 2010-143988 | 7/2010 |
| JP | 2010-169810 | 8/2010 |
| JP | 2010-224158 | 10/2010 |
| JP | 2011-52202 | 3/2011 |
| JP | 2011-190424 | 9/2011 |
| KR | 20030075135 | 9/2003 |
| KR | 20090127221 | 12/2009 |
| KR | 2010/0069559 | 6/2010 |
| KR | 2011/0033181 | 3/2011 |
| TW | 200811229 | 3/2008 |
| TW | 201105720 | 2/2011 |
| WO | 2007/125806 | 11/2007 |
| WO | 2011/062053 | 5/2011 |

OTHER PUBLICATIONS

International Preliminary Report on Patentability, PCT/JP2012/082968, dated Aug. 7, 2014.

English Translation of International Search Report, International Application No. PCT/JP2012/060978, dated May 29, 2012.

English Translation of International Preliminary Report on Patentability, International Application No. PCT/JP2012/060978, dated Nov. 7, 2013.

English Translation of International Search Report, International Application No. PCT/JP2012/082874, dated Apr. 2, 2013.

English Translation of International Preliminary Report on Patentability, International Application No. PCT/JP2012/082874, dated Aug. 7, 2014.

English Translation of International Search Report and Written Opinion, International Application No. PCT/JP2011/072612, dated Nov. 1, 2011.

Prosecution History from U.S. Appl. No. 14/374,444 through Mar. 3, 2016.

Prosecution History from U.S. Appl. No. 13/993,613 through Mar. 3, 2016.

Notice of Allowance, U.S. Appl. No. 14/113,541, dated Dec. 22, 2014.

Non-Final Office Action for U.S. Appl. No. 13/993,613, dated Jun. 6, 2017 (19 pages).

\* cited by examiner

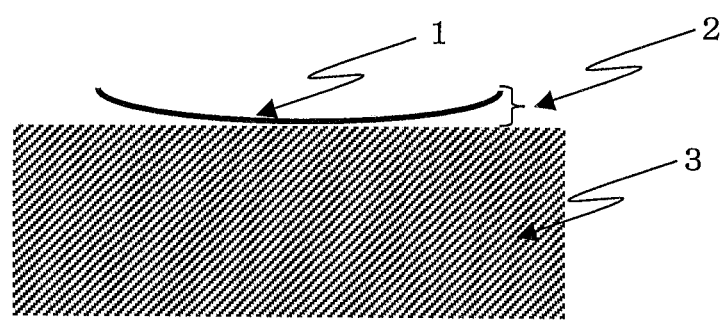

RESIN COMPOSITION FOR PIGMENT-CONTAINING INSULATING FILM, AND USE THEREOF

This application claims benefit from International Application No. PCT/JP2012/082968, which was filed on Dec. 19, 2012, which in turn claims priority to Japanese Application No. 2012-013340, which was filed on Jan. 25, 2012; Japanese Application No. 2012-013341, which was filed on Jan. 25, 2012; Japanese Application No. 2012-089522, which was filed on Apr. 10, 2012; and Japanese Application No. 2012-089523, which was filed on Apr. 10, 2012; wherein the entireties of said patent applications are incorporated herein by reference.

TECHNICAL FIELD

The present invention relates to a novel resin composition for a pigment-containing insulating film and use thereof. More specifically, the present invention relates to a resin composition for forming a pigment-containing insulating film which resin composition is excellent in tack property after drying and allows a resultant pigment-containing insulating film to be excellent in flexibility and electrical insulation reliability and to be small in warpage after curing, a resin film for a pigment-containing insulating film, a pigment-containing insulating film, and a printed wiring board provided with a pigment-containing insulating film. Note that in a case where the pigment is a black pigment, a resultant black insulating film is excellent in hiding property. Meanwhile in a case where the pigment is a white pigment, a resultant white insulating film is excellent in reflectance.

BACKGROUND ART

Polyimide resin is widely used for electric and electronic purposes due to its excellence in heat resistance, electrical insulation reliability, chemical resistance, and mechanical properties. For example, polyimide resin is used as an insulating film and/or a protective coating agent on a semiconductor device, a substrate material and/or a surface protecting material for a flexible circuit board, an integrated circuit board, or the like. Alternatively, polyimide resin is used also to provide a microcircuit with an interlayer insulating film and/or a protective film.

In particular, in a case where polyimide resin is used as a surface protecting material for a flexible circuit board, a cover lay film obtainable by applying an adhesive to a molded article such as a polyimide film is used. The cover lay film is generally adhered to the flexible circuit board by the following method. That is, an opening is secured in advance, by punching or the like method, at a bonding portion between the cover lay film and a terminal portion or a component of a circuit, the opening and the cover lay film are aligned with each other, and the cover lay film and the flexible circuit board are then subjected to thermocompression bonding by a thermal press or the like.

It is, however, difficult to secure an opening in a thin cover lay film with high accuracy, and the alignment to bond the cover lay film and the flexible circuit board to each other is usually carried out manually. This causes insufficiently accurate alignment and low workability at the lamination, thus leading to increases in cost.

Meanwhile, a surface protecting material for a circuit board can be provided by using a method in which a resin composition, called a solder resist, having an insulation function is directly applied on a circuit board, and the resin composition is then cured to provide an insulating film. The solder resist has excellent flexibility and electrical insulation reliability as an insulating material. However, the solder resist has excess viscosity (poor tack property) caused after a coating film formed by applying the resin composition to a circuit board is dried, decreases in workability and yield, and/or process pollution.

There have been proposed various solder resists that have improved tack property while maintaining flexibility and electrical insulation reliability.

Further, there has been proposed a thermosetting resin composition that offers a good balance of properties such as printability, tack property, matting property, electrical insulation property, and adhesiveness to a coated product (see, for example, Patent Literature 1).

CITATION LIST

Patent Literatures

Patent Literature 1
International Application Publication, No. WO 2007/125806

SUMMARY OF INVENTION

Technical Problem

Patent Literature 1 listed above proposes various methods for solving the problems concerning solder resists. The thermosetting resin composition described in Patent Literature 1 is excellent in excess viscosity caused after the coating film is dried and further cured by heat, but still has the problem that excess viscosity is caused after the coating film is dried.

Solution to Problem

The inventor of the present invention studied diligently to solve the above problems, and finally found that it is possible to obtain a resin composition for a pigment-containing insulating film which resin composition is excellent in tack property after drying and allows a resultant pigment-containing insulating film to be excellent in flexibility and electrical insulation reliability and to be small in warpage after curing, and to obtain a resin film for a pigment-containing insulating film, a pigment-containing insulating film, and a printed wiring board provided with a pigment-containing insulating film from a resin composition for a pigment-containing insulating film which resin composition contains at least a (A) binder polymer and (B) pigment-containing cross-linked polymer particles. Based on this finding, the inventor of the present invention accomplished the present invention. For example, the pigment is preferably a black pigment because a resultant black insulating film is excellent in hiding property. Furthermore, the pigment is preferably a white pigment because a resultant white insulating film is excellent in reflectance. The present invention, which provides the following novel resin composition for a pigment-containing insulating film, can solve the above problems.

That is, the present invention encompasses the following:

(1) A resin composition for a pigment-containing insulating film, the resin composition including at least:

a (A) binder polymer; and (B) pigment-containing cross-linked polymer particles.

(2) The resin composition as set forth in (1), wherein the (B) pigment-containing cross-linked polymer particles each have a urethane bond in its molecule.

(3) The resin composition as set forth in (1) or (2), wherein the (B) pigment is a black pigment or a white pigment.

(4) The resin composition as set forth in (3), wherein the black pigment is carbon black.

(5) The resin composition as set forth in (3), wherein the white pigment is titanium oxide.

(6) The resin composition as set forth in any one of (1) through (5), further including a (C) thermosetting resin.

(7) The resin composition as set forth in any one of (1) through (6), further including:

a (D) compound having a radically polymerizable group in its molecule; and a (E) photo-polymerization initiator.

(8) The resin composition as set forth in any one of (1) through (7), wherein the (A) binder polymer has at least one selected from the group consisting of the following (a1) through (a3): a (a1) urethane bond; a (a2) carboxyl group; and an (a3) imide group.

(9) The resin composition as set forth in any one of (1) through (8), wherein the (B) pigment-containing cross-linked polymer particles are in a range from 1 µm to 20 µm in average particle diameter.

(10) The resin composition as set forth in any one of (1) through (9), wherein an amount of oil absorption of the (B) pigment-containing cross-linked polymer particles is not less than 50 ml/100 g.

(11) The resin composition as set forth in any one of (1) through (10), wherein the (B) pigment-containing cross-linked polymer particles are mixed in an amount ranging from 30 parts by weight to 100 parts by weight, with respect to 100 parts by weight of the (A) binder polymer.

(12) The resin composition as set forth in any one of (1) through (11), further including:

a (F) phosphoric flame retardant.

(13) The resin composition as set forth in (12), wherein the (F) phosphoric flame retardant is phosphinate.

(14) The resin composition as set forth in (12) or (13), wherein the (F) phosphoric flame retardant is mixed in an amount ranging from 5 parts by weight to 100 parts by weight, with respect to 100 parts by weight of the (A) binder polymer.

(15) A resin film for a pigment-containing insulating film, the resin film being obtained by applying, to a surface of a base material, the resin composition for a pigment containing insulating film which resin composition is recited in any one of (1) through (14) and then drying the resin composition.

(16) A pigment-containing insulating film obtained by curing the resin film for a pigment-containing insulating film which resin film is recited in (15).

(17) A printed wiring board provided with a pigment-containing insulating film, wherein the printed wiring board is covered with the pigment-containing insulating film recited in (16).

(18) A resin film for a pigment-containing insulating film, the resin film being obtained from the resin composition for a pigment-containing insulating film which resin composition is recited in any one of (1) through (14).

(19) A pigment-containing insulating film obtained from the resin composition for a pigment-containing insulating film which resin composition is recited in any one of (1) through (14).

(20) A printed wiring board provided with a pigment-containing insulating film, wherein the printed wiring board is covered with the pigment-containing insulating film as recited in (19).

Advantageous Effects of Invention

The resin composition for a pigment-containing insulating film in accordance with the present invention contains at least a (A) binder polymer and (B) pigment-containing cross-linked polymer particles, as described above. With this feature, the resin composition for a pigment-containing insulating film in accordance with the present invention is excellent in tack property after drying and allows a resultant pigment-containing insulating film to be excellent in flexibility and electrical insulation reliability and to be small in warpage after curing. Accordingly, the resin composition for a pigment-containing insulating film in accordance with the present invention can be used for protective films etc. for various circuit substrates and produces excellent effects. For example the pigment is preferably a black pigment because a resultant black insulating film is excellent in hiding property. Furthermore, the pigment is preferably a white pigment because a resultant white insulating film is excellent in reflectance.

BRIEF DESCRIPTION OF DRAWINGS

FIG. 1 is a schematic view showing how an amount of warpage of a film is measured.

DESCRIPTION OF EMBODIMENTS

The description below deals in detail with first (I) a resin composition for a pigment-containing insulating film and then (II) a method of using a resin composition for a pigment-containing insulating film, in accordance with the present invention.

(I) Resin Composition for Pigment-Containing Insulating Film

A resin composition for a pigment-containing insulating film in accordance with the present invention is a resin composition containing at least (A) a binder polymer and (B) pigment-containing cross-linked polymer particles, and is a resin composition used to form a pigment-containing insulating film.

The inventor of the present invention has found that the aforementioned resin composition for a pigment-containing insulating film has various excellent properties, and presumes that it is for the following reasons. The component (B) of the present invention is pigment-containing cross-linked polymer particles. Such pigment-containing cross-linked polymer particles serve to provide irregularities formed at a surface of a resultant insulating film, thus allowing an insulating film obtained after drying a base material having the resin composition applied thereto to have excellent tack property. Further, the component (B) is soft. This causes no decrease in flexibility of an obtained pigment-containing insulating film. Still further, the component (B) has a crosslinked structure. This allows a resultant pigment-containing insulating film to have excellent heat resistance and chemical resistance. Containing a filler component at a high proportion will generally decrease flexibility of resisting repeated foldings. However, a combination of the components (A) and (B) surprisingly provides a cured film having very excellent flexibility and excellent folding endurance. The inventor presumes that such an effect is achieved for the following reason; the component (A), which forms a matrix of the cured film, seeps into the component (B), and high adhesiveness is thus achieved at an interface between the component (A) and the component (B). The inventor further presumes that the above effect is achieved for the following reason; the component (B) has a carbonate skelton and thus provides an insulating film having excellent hydrolysis resistance and having excellent electrical insulation reliability at high temperature and high humidity, without sacrificing the flexibility and folding endurance as described above.

Moreover, in a case where the pigment is a black pigment for example, the black pigment is covered by cross-linked polymer particles, which are insulators. Accordingly, there arises no decline in electrical insulation reliability even in a case where the black pigment is added in such an amount that a sufficient hiding property can be achieved. Consequently, it is possible to obtain an insulating film that is excellent in electrical insulation reliability even when it is placed under an environment of high temperature and high humidity for a long term. Furthermore, according to such a resin composition for a black insulating film, it is also possible to solve a problem that confidential information included in a circuit pattern of a printed wiring board is easily leaked because the circuit can be seen through due to insufficiency of a circuit hiding property of an obtained cured film.

Meanwhile, in a case where the pigment is a white pigment for example, the white pigment is covered by soft cross-linked polymer particles. It is therefore possible to obtain an insulating film that (i) is suppressed in occurrence of cracking after folding a cured film even in a case where the white pigment is added in such an amount that sufficient reflectance can be achieved and (ii) is excellent in electrical insulation reliability even when it is placed under an environment of high temperature and high humidity for a long term. Furthermore, according to such a resin composition for a white insulating film, it is also possible to solve a problem that when an obtained cured film is used for a printed wiring board on which an LED chip is mounted, light from the LED chip cannot be efficiently utilized due to insufficiency of reflectance of the obtained cured film.

The following description deals with (A) a binder polymer, (B) pigment-containing cross-linked polymer particles, (C) a thermosetting resin, (D) a compound having a radically polymerizable group in its molecule, (E) a photo-polymerization initiator, (F) a phosphoric flame retardant, and other components. The following description also deals with a method of mixing the resin composition for a pigment-containing insulating film.

<(A) Binder Polymer>

The (A) binder polymer of the present invention is a polymer that is soluble in an organic solvent and that has a weight-average molecular weight of not lower than 1,000 and not higher than 1,000,000 based on polyethylene glycol.

The above organic solvent is not particularly limited to any specific one. Examples of the organic solvent encompass: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; hexamethylphosphoramide; and γ-butyrolactone. Further, these organic polar solvents can be used optionally in combination with an aromatic hydrocarbon such as xylene or toluene, as needed.

Further examples of the organic solvent encompass: solvents of symmetric glycol diethers such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan ethylene glycol monobutyl ether, diethylene glycol monoethyl ether, diethylene glycol monobutyl ether, and ethylene glycol monoethyl ether.

Organic solvent solubility, which is an index of solubility in organic solvent, can be measured as parts by weight of a base polymer that are dissolvable in 100 parts by weight of an organic solvent. If not smaller than 5 parts by weight of a base polymer are dissolved in 100 parts by weight of an organic solvent, that base polymer can be determined as being soluble in organic solvent. How the organic solvent solubility is measured is not particularly limited to any specific one. The organic solvent solubility can be measured by, for example, a method of (i) adding 5 parts by weight of a base polymer to 100 parts by weight of an organic solvent, (ii) stirring the mixture at 40° C. for 1 hour, (iii) cooling the resultant mixture down to a room temperature, (iv) leaving the cooled mixture to stand for more than 24 hours, and (v) confirming that the resulting solution is a uniform solution with no undissolved matter or with no precipitate produced.

The weight-average molecular weight of the component (A) of the present invention can be measured by, for example, the following method.

(Measurement of Weight-Average Molecular Weight)

Apparatus used: equivalent of HLC-8220GPC manufactured by TOSOH Corporation

Column: TSK gel Super AWM-H manufactured by TOSOH Corporation (6.0 mm I.D.×15 cm) (2 columns)

Guard column: TSK guard column Super AW-H manufactured by TOSOH Corporation

Carrier: 30 mM LiBr+20 mM $H_3PO_4$ in DMF

Flow speed: 0.6 mL/min

Column temperature: 40° C.

Detection conditions: RI: polarity (+), response (0.5 sec)

Sample concentration: approximately 5 mg/mL

Reference standard: PEG (polyethylene glycol)

Controlling the weight-average molecular weight within the above range is preferable because the weight-average molecular weight controlled as such allows a pigment-containing insulating film produced to be excellent in flexibility and chemical resistance. A weight-average molecular weight of not higher than 1,000 may decrease the flexibility and/or chemical resistance of the insulating film, whereas a weight-average molecular weight of not smaller than 1,000,000 may increase viscosity of a resin composition for a pigment-containing insulating film.

The component (A) of the present invention is not particularly limited to any specific one. Examples of the component (A) encompass: polyurethane resins, poly(meth)acrylic resins, polyvinyl resins, polystyrene resins, polyethylene resins, polypropylene resins, polyimide resins, polyamide resins, polyacetal resins, polycarbonate resins, polyester resins, polyphenylene ether resins, polyphenylene sulfide resins, polyether sulfone resins, and polyether ether ketone resins. These resins can be used solely, or two or more types thereof can be used in combination. Among the above resins, a resin having a (a1) urethane bond in its molecule is preferable because such an arrangement allows a pigment-containing insulating film produced from the resultant resin composition for a pigment-containing insulating film to be improved in flexibility and folding endurance and to thus have less warpage. Further, a resin containing a (a2) carboxyl group is preferable because such an arrangement allows a pigment-containing insulating film produced from the resultant resin composition for a pigment-containing insulating film to be improved in adhesiveness with respect to a base material. Still further, a resin containing a (a3) imide group is preferable because such an arrangement allows a pigment-containing insulating film produced from the resultant resin composition for a pigment-containing insulating film to be improved in heat resistance, flame retardancy, and electrical insulation reliability. Still further, two or three of the following resins: the resin having a (a1) urethane bond; the resin containing a (a2) carboxyl group; and the resin containing a (a3) imide group are preferable because such an arrangement causes respective properties of these resins to be worked synergistically and thus allows an insulating film to be excellent in various properties.

<Resin Having (a1) Urethane Bond>

The resin having the (a1) urethane bond in accordance with the present invention is a polymer that (i) has a repeating unit having at least one urethane bond in its molecule and (ii) has a weight-average molecular weight of not lower than 1,000 and not higher than 1,000,000 based on polyethylene glycol.

In the case of a resin having the (a1) urethane bond in its molecule, the component (A) has very good affinity with the component (B) in a case where the component (B) has a urethane bond in its molecule. This causes the resin having the (a1) urethane bond to seep into the component (B) in accordance with the present invention from cross-linked polymer particle surfaces of the component (B), and thus achieves high adhesiveness with a matrix. This allows a pigment-containing insulating film produced from a resin composition for an insulating film to have improved flexibility and folding endurance and to be small in warpage.

The resin having the (a1) urethane bond in accordance with the present invention can be produced through any reaction. The resin can be produced by, for example, reacting (i) a diol compound represented by General Formula (1):

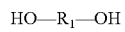 General Formula (1)

where $R_1$ represents a divalent organic group, with (ii) a diisocyanate compound represented by General Formula (2):

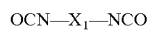 General Formula (2)

where $X_1$ represents a divalent organic group, into a structure containing a repeating unit that has a urethane bond represented by General Formula (3):

General Formula (3)

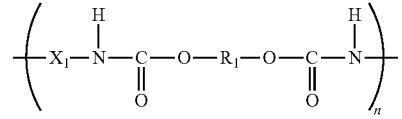

where $R_1$ and $X_1$ each independently represent a divalent organic group, and n represents an integer of 1 or more.

The diol compound of the present invention is not particularly limited to any specific one as long as it has the aforementioned structure. Examples of the diol compound encompass: alkylene diols such as ethyleneglycol, diethylene glycol, propylene glycol, 1,3-butanediol, 1,4-butanediol, 1,5-pentanediol, neopentyl glycol, 3-methyl-1,5-pentanediol, 1,6-hexanediol, 1,8-octanediol, 2-methyl 1,8-octanediol, 1,9-nonanediol, 1,10-decanediol, 1,4-cyclohexanediol, and 1,4-cyclohexanedimethanol; polyoxyalkylene diols such as polyethylene glycol, polypropylene glycol, polytetramethylene glycol, and a random copolymer of tetramethylene glycol and neopentyl glycol; a polyester diol obtained by reacting polyhydric alcohol with polybasic acid; a polycarbonate diol having a carbonate skeleton; a polycaprolactone diol obtained by performing ring opening addition of lactones such as γ-butyl lactone, ε-caprolactone, and δ-valerolactone; bisphenol A and an ethylene oxide adduct of bisphenol A; a propylene oxide adduct of bisphenol A; hydrogenated bisphenol A and an ethylene oxide adduct of hydrogenated bisphenol A; and a propylene oxide adduct of hydrogenated bisphenol A. These compounds can be used solely, or two or more types thereof can be used in combination.

In particular, a long chain diol, such as polyethylene glycol, polypropylene glycol, polytetra-methylene glycol, polyoxyalkylene diol, polyester diol, polycarbonate diol, or polycaprolactone diol is preferable because such an arrangement allows a pigment-containing insulating film to be decreased in elasticity and excellent in flexibility and small warpage.

The diisocyanate compound of the present invention is not particularly limited to any specific one as long as it has the aforementioned structure. Examples of the diisocyanate compound encompass: aromatic diisocyanate compounds such as diphenylmethane-2,4'-diisocyanate, 3,2'- or 3,3'- or 4,2'- or 4,3'- or 5,2'- or 5,3'- or 6,2'- or 6,3'-dimethyl diphenylmethane-2,4'-diisocyanate, 3,2'- or 3,3'- or 4,2'- or 4,3'- or 5,2'- or 5,3'- or 6,2'- or 6,3'-diethyl diphenylmethane-2,4'-diisocyanate, 3,2'- or 3,3'- or 4,2'- or 4,3'- or 5,2' or 5,3'- or 6,2'- or 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenylether-4,4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, and 4,4'-[2,2-bis(4-phenoxyphenyl)propane] diisocyanate; alicyclic diisocyanate compounds such as hydrogenated diphenylmethane diisocyanate, hydrogenated xylylene diisocyanate, isophorone diisocyanate, and norbornene diisocyanate; and aliphatic diisocyanate compounds such as hexamethylene diisocyanate, trimethyl hexamethylene diisocyanate, and lysine diisocyanate. These compounds can be used solely, or two or more types of them can be used in combination.

In particular, alicyclic diisocyanate and an aliphatic diisocyanate compound are preferably used because such an arrangement allows a pigment-containing insulating film to have excellent flexibility.

The resin having a urethane bond in accordance with the present invention is synthesized by a method of (i) mixing the diol compound with the diisocyanate compound in such respective amounts that isocyanate groups and hydroxyl groups are contained at a number ratio of isocyanate groups/hydroxyl groups of not smaller than 0.5 and not larger than 2.0, and (ii) reacting the mixture without any solvent or in an organic solvent.

In the case where two or more types of the diol compound are used, the reaction thereof with the diisocyanate compound may be performed after the two or more types of the diol compound are mixed with each other, or each of the two or more types of the diol compound may be reacted with the diisocyanate compound independently. Alternatively, the reaction may be performed such that (i) a diol compound is initially reacted with the diisocyanate compound, (ii) a terminal isocyanate compound is further reacted with another diol compound, and (iii) a product obtained after the reaction is further reacted with the diisocyanate compound. Further, in the case where two or more types of the diisocyanate compound are used, the reaction can be performed in the same manner as above. In this way, an intended resin having a urethane bond in its molecule can be prepared.

The reaction between the diol compound and the diisocyanate compound is performed at a temperature of preferably in a range from 40° C. to 160° C., and more preferably in a range from 60° C. to 150° C. If the temperature is less than 40° C., the reaction takes too much time. If the temperature exceeds 160° C., a three-dimensional reaction occurs during the reaction, which easily causes gelatinization. How long the reaction between the diol compound and the diisocyanate compound is performed can be determined as appropriate depending on a batch scale or a reaction condition to be adopted. Further, the reaction may optionally be performed in the presence of a catalyst such as (i) a tertiary amine or (ii) a metal compound or semi-metal compound (for example, alkaline metal, alkaline earth metal, tin, zinc, titanium, or cobalt).

The above reaction can be performed without any solvent. However, the reaction is desirably performed with an organic solvent system for the sake of better control of the reaction. Examples of the organic solvent encompass those listed above.

It is desirable that the organic solvent used in the reaction be added in such an amount that a solute weight concentration in a reaction solution, that is, a concentration of the reaction solution, is not lower than 5% by weight and not higher than 90% by weight. The solute weight concentration in the reaction solution is more preferably not lower than 10% by weight and not higher than 80% by weight. The concentration of not higher than 5% by weight will make it difficult to produce a polymerization reaction and thus decrease a reaction speed, and as a result, an intended structural substance may not be prepared.

The resin having the (a1) urethane bond in accordance with the present invention may further contain a carboxyl group and/or an imide group. The resin having the (a1) urethane bond preferably contains a carboxyl group. This is because such an arrangement allows an insulating film produced from the resultant resin composition for an insulating film to be improved in adhesiveness with respect to a base material. On the other hand, in a case where the resin having the (a1) urethane bond contains an imide group, such an arrangement allows an insulating film produced from the resultant resin composition for an insulating film to be improved in (i) heat resistance and (ii) electrical insulation reliability at high temperature and high humidity. As such, in a case where such an insulating film is used as a covering material for a printed wiring board, it is possible to prepare a highly-reliable printed wiring board.

The resin containing a carboxyl group and having the (a1) urethane bond can be produced through any reaction. Such a resin can be produced by, for example, reacting, in addition to the diol compound and the diisocyanate compound, a compound containing two hydroxyl groups and one carboxyl group, the compound being represented by General Formula (4):

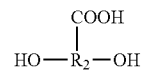

General Formula (4)

where $R_2$ represents a trivalent organic group.

The compound containing two hydroxyl groups and one carboxyl group in accordance with the present invention is not particularly limited to any specific one as long as it has the aforementioned structure. Examples of the compound encompass: 2,2-bis(hydroxymethyl)propionic acid; 2,2-bis(2-hydroxyethyl)propionic acid; 2,2-bis(3-hydroxypropyl)propionic acid; 2,3-dihydroxy-2-methylpropionic acid; 2,2-bis(hydroxymethyl)butanoic acid; 2,2-bis(2-hydroxyethyl)butanoic acid; 2,2-bis(3-hydroxypropyl)butanoic acid; 2,3-dihydroxybutanoic acid; 2,4-dihydroxy-3,3-dimethylbutanoic acid; 2,3-dihydroxyhexadecanoic acid; 2,3-dihydroxybenzoic acid; 2,4-dihydroxybenzoic acid; 2,5-dihydroxybenzoic acid; 2,6-dihydroxybenzoic acid; 3,4-dihydroxybenzoic acid; and 3,5-dihydroxybenzoic acid. These compounds can be used solely, or two or more types thereof can be used in combination.

The resin containing the imide group and having the (a1) urethane bond can be produced through any reaction. Such a resin can be produced by, for example, reacting, in addition to the diol compound and the diisocyanate compound, a tetracarboxylic acid dianhydride represented by General Formula (5):

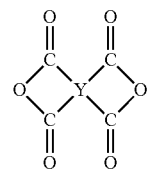

General Formula (5)

where Y represents a tetravalent organic group.

The tetracarboxylic acid dianhydride in accordance with the present invention is not particularly limited to any specific one as long as it has the aforementioned structure. Examples of the tetracarboxylic acid dianhydride encompass: 3,3',4,4'-benzophenone tetracarboxylic acid dianhydride; pyromellitic acid dianhydride; 3,3',4,4'-oxydiphthalic acid dianhydride; 2,2-bis[4-(3,4-dicarboxyphenoxy)phenyl]propane dianhydride; 2,2-bis(4-hydroxyphenyl)propane dibenzoate-3,3',4,4'-tetracarboxylic acid dianhydride; 3,3',4, 4'-diphenyl sulfone tetracarboxylic acid dianhydride; 3,3',4, 4'-biphenyltetracarboxylic acid dianhydride; 2,3,3',4-biphenyltetracarboxylic acid dianhydride; and 5-(2,5-dioxotetrahydro-3-furanyl)-3-methyl-3-cyclohexene-1,2-dicarboxylic acid anhydride. These tetracarboxylic acid dianhydrides can be used solely, or two or more types thereof can be used in combination.

<Resin Containing (a2) Carboxyl Group>

The resin containing the (a2) carboxyl group in accordance with the present invention is a polymer that (i) has a repeating unit having at least one carboxyl group in its molecule and (ii) has a weight-average molecular weight of not lower than 1,000 and not higher than 1,000,000 based on polyethylene glycol.

The resin containing the (a2) carboxyl group in accordance with the present invention can be produced through any reaction. For example, the aforementioned method of producing the resin having the (a1) urethane bond is used so as to react, in addition to the diol compound and the diisocyanate compound, the compound, which is represented by General Formula (4) above, containing two hydroxyl groups and one carboxyl group.

Alternatively, the resin containing the (a2) carboxyl group in accordance with the present invention can be synthesized by a method of reacting a (meth)acrylic acid and a (meth) acrylic acid ester derivative. Note that a (meth)acrylic acid is an acrylic acid or methacrylic acid, and a (meth)acrylic acid ester derivative is an acrylic acid ester derivative or a methacrylic acid ester derivative.

The reaction between a (meth)acrylic acid and a (meth) acrylic acid ester can be carried out by any method. Such a reaction can be carried out by, for example, reacting a (meth)acrylic acid and/or a (meth)acrylic acid ester derivative in a solvent in the presence of a radical polymerization initiator.

The above (meth)acrylic acid ester derivative in accordance with the present invention is not particularly limited to any specific one. Examples of the (meth)acrylic acid ester derivative encompass: methyl (meth)acrylate; ethyl (meth) acrylate; butyl (meth)acrylate; isobutyl (meth)acrylate; tertiary-butyl (meth)acrylate; hexyl (meth)acrylate; 2-ethylhexyl (meth)acrylate; octyl (meth)acrylate; nonyl (meth) acrylate; decyl (meth)acrylate; dodecyl (meth)acrylate; stearyl (meth)acrylate; and benzyl (meth)acrylate. These (meth)acrylic acid ester derivatives can be used solely, or two or more types thereof can be used in combination. The present invention preferably uses, among the above (meth) acrylic acid ester derivatives, methyl (meth)acrylate, ethyl (meth)acrylate, or butyl (meth)acrylate in particular for better flexibility and chemical resistance of an insulating film.

Examples of the above radical polymerization initiator encompass: azo-based compounds such as azobisisobutyronitrile, azobis(2-methylbutylonitrile), and 2,2'-azobis-2,4-dimethyl valeronitrile; organic peroxides such as t-butylhydroperoxide, cumene hydroperoxide, benzoyl peroxide, dicumyl peroxide, and di-t-butyl peroxide; persulfates such as potassium persulfate, sodium persulfate, and ammonium persulfate; and hydrogen peroxide. These radical polymerization initiators can be used solely, or two or more types thereof can be used in combination.

The radical polymerization initiator is used in an amount preferably of, with respect to 100 parts by weight of a monomer used, in a range from 0.001 parts by weight to 5 parts by weight, and more preferably in a range from 0.01 parts by weight to 1 part by weight. If the amount is smaller than 0.001 parts by weight, the reaction does not proceed readily. If the amount is larger than 5 parts by weight, the molecular weight may be decreased.

The solvent used in the reaction is added in such an amount that a solute weight concentration in a reaction solution, that is, a concentration of the reaction solution, is preferably (i) not lower than 5% by weight and not higher than 90% by weight, and more preferably (ii) not lower than 20% by weight and not higher than 70% by weight. If the concentration of the reaction solution is lower than 5% by weight, it will be difficult to produce a polymerization reaction, and a reaction speed will decrease. As a result, an intended structural substance may not be prepared. If the concentration of the reaction solution is higher than 90% by weight, the reaction solution will be highly viscous, which may render the reaction ununiform.

The reaction is performed at a temperature preferably (i) in a range from 20° C. to 120° C., and more preferably (ii) in a range from 50° C. to 100° C. If the reaction temperature is lower than 20° C., the reaction takes too much time. If the temperature exceeds 120° C., a rapid procession of the reaction and a side reaction may cause three-dimensional crosslinking, which may in turn cause gelatinization. How long the reaction is performed can be determined as appropriate depending on a batch scale or a reaction condition to be adopted.

Further alternatively, the resin containing the (a2) carboxyl group in accordance with the present invention can be synthesized by a method of reacting (i) a resin containing a functional group, such as a hydroxyl group, an isocyanate group, an amino group, or an epoxy group, and (ii) a polyvalent carboxylic acid compound.

<Resin Containing (a3) Imide Group>

The resin containing the (a3) imide group in accordance with the present invention is a polymer that (i) has a repeating unit having at least one imide group in its molecule and (ii) has a weight-average molecular weight of not lower than 1,000 and not higher than 1,000,000 based on polyethylene glycol.

The resin containing the (a3) imide group in accordance with the present invention can be produced through any reaction. Such a resin can be produced by, for example, reacting the tetracarboxylic acid dianhydride represented by General Formula (5) above with a diamino compound represented by General Formula (6):

$$H_2N\text{-}z\text{-}NH_2 \hspace{4cm} \text{General formula (6)}$$

where Z represents a divalent organic group.

Tetracarboxylic acid dianhydride in accordance with the present invention is not particularly limited as long as it has the aforementioned structure. Examples of tetracarboxylic acid dianhydride encompass 3,3',4,4'-benzophenone tetracarboxylic acid dianhydride, pyromellitic acid dianhydride, 3,3',4,4'-oxydiphthalic acid dianhydride, 2,2-bis[4-(3,4-dicarboxyphenoxy)phenyl]propane dianhydride, 2,2-bis(4-hydroxyphenyl)propane dibenzoate-3,3',4,4'-tetracarboxylic acid dianhydride, 3,3',4,4'-diphenyl sulfone tetracarboxylic acid dianhydride, 3,3',4,4'-biphenyltetracarboxylic acid dianhydride, 2,3,3',4-biphenyltetracarboxylic acid dianhydride, and 5-(2,5-dioxotetrahydro-3-furanyl)-3-methyl-3-cyclohexene-1,2-dicarboxylic acid anhydride. These tetracarboxylic acid dianhydrides can be used solely, or two or more types thereof can be used in combination.

The diamino compound of the present invention is not particularly limited to any specific one as long as it has the aforementioned structure. Examples of the diamino compound encompass: diamino phenols such as m-phenylenediamine, o-phenylenediamine, p-phenylenediamine, m-aminobenzylamine, p-aminobenzylamine, bis(3-aminophenyl)sulfide, (3-aminophenyl) (4-aminophenyl) sulfide, bis(4-aminophenyl)sulfide, bis(3-aminophenyl)sulfoxide, (3-aminophenyl)(4-aminophenyl)sulfoxide, bis(4-aminophenyl)sulfoxide, bis(3-aminophenyl)sulfone, (3-aminophenyl)(4-aminophenyl)sulfone, bis(4-aminophenyl)sulfone, 3,4'-diaminobenzophenone, 4,4'-diaminobenzophenone, 3,3'-diaminobenzophenone, 3,3'-diaminodiphenylmethane, 3,4'-diaminodiphenylmethane, 4,4'-diaminodiphenylmethane, 4,4'-diaminodiphenylether, 3,3'-diaminodiphenylether, 3,4'-diaminodiphenylether, bis[4-(3-aminophenoxy)phenyl]sulfoxide, bis[4-(aminophenoxy)phenyl]sulfoxide, (4-aminophenoxyphenyl)(3-aminophenoxyphenyl)phenyl]sulfoxide, bis[4-(3-aminophenoxy)phenyl]sulfone, bis[4-(4-aminophenoxy)phenyl]sulfone, (4-aminophenoxyphenyl)(3-aminophenoxyphenyl)phenyl]sulfone, bis[4-(3-aminophenoxy)phenyl]sulfide, bis[4-(aminophenoxy)phenyl]sulfide, (4-aminophenoxyphenyl)(3-aminophenoxyphenyl)phenyl]sulfide, 3,3'-diaminobenzanilide, 3,4'-diaminobenzanilide, 4,4'-diaminobenzanilide, bis[4-(3-aminophenoxy)phenyl]methane, bis[4-(4-aminophenoxy)phenyl]methane, [4-(4-aminophenoxyphenyl)][4-(3-aminophenoxyphenyl)]methane, 1,1-bis[4-(3-aminophenoxy)phenyl]ethane, 1,1-bis[4-(4-aminophenoxy)phenyl]ethane, 1,1-[4-(4-aminophenoxyphenyl)][4-(3-aminophenoxyphenyl)]ethane, 1,2-bis[4-(3-aminophenoxy)phenyl]ethane, 1,2-bis[4-(4-aminophenoxy)phenyl]ethane, 1,2-[4-(4-aminophenoxyphenyl)][4-(3-aminophenoxyphenyl)]ethane, 2,2-bis[4-(3-aminophenoxy)phenyl]propane, 2,2-bis[4-(4-aminophenoxy)phenyl]propane, 2,2-[4-(4-aminophenoxyphenyl)][4-(3-aminophenoxyphenyl)]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 2,2-[4-(4-aminophenoxyphenyl)][4-(3-aminophenoxyphenyl)]-1,1,1,3,3,3-hexafluoropropane, 1,3-bis(3-aminophenoxy)benzene, 1,4-bis(3-aminophenoxy)benzene, 1,4-bis(4-aminophenoxy)benzene, 1,3-bis(4-aminophenoxy)benzene, 4,4'-bis(4-aminophenoxy)biphenyl, 4,4'-bis(3-aminophenoxy)biphenyl, bis[4-(3-aminophenoxy)phenyl]ketone, bis[4-(4-aminophenoxy)phenyl]ketone, bis[4-(3-aminophenoxy)phenyl]ether, bis[4-(4-aminophenoxy)phenyl]ether, polytetramethylene oxide-di-p-aminobenzoate, poly(tetramethylene/3-methyltetramethylene ether)glycol bis(4-aminobenzoate), trimethylene-bis(4-aminobenzoate), p-phenylene-bis(4-aminobenzoate), m-phenylene-bis(4-aminobenzoate), bisphenol A-bis(4-aminobenzoate), 2,4-diaminobenzoic acid, 2,5-diaminobenzoic acid, 3,5-diaminobenzoic acid, 3,3'-diamino-4,4'-dicarboxybiphenyl, 4,4'-diamino-3,3'-dicarboxybiphenyl, 4,4'-diamino-2,2'-dicarboxybiphenyl, [bis(4-amino-2-carboxy)phenyl]methane, [bis(4-amino-3-carboxy)phenyl]methane, [bis(3-amino-4-carboxy)phenyl]methane, [bis(3-amino-5-carboxy)phenyl]methane, 2,2-bis[3-amino-4-carboxyphenyl]propane, 2,2-bis[4-amino-3-carboxyphenyl]propane, 2,2-bis[3-amino-4-carboxyphenyl]hexafluoropropane, 2,2-bis[4-amino-3-carboxyphenyl]hexafluoropropane, 3,3'-diamino-4,4'-dicarboxydiphenyl ether, 4,4'-diamino-3,3'-dicarboxydiphenyl ether, 4,4'-diamino-2,2'-dicarboxydiphenyl ether, 3,3'-diamino-4,4'-dicarboxydiphenyl sulfone, 4,4'-diamino-3,3'-dicarboxydiphenyl sulfone, 4,4'-diamino-2,2'-dicarboxydiphenyl sulfone, 2,3-diaminophenol, 2,4-diaminophenol, 2,5-diaminophenol, and 3,5-diaminophenol; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2',5,5'-tetrahydroxybiphenyl; dihydroxydiphenylmethanes such as 3,3'-diamino-4,4'-dihydroxydiphenylmethane, 4,4'-diamino-3,3'-dihydroxydiphenylmethane, and 4,4'-diamino-2,2'-dihydroxydiphenylmethane; bis[hydroxyphenyl]propanes such as 2,2-bis[3-amino-4-hydroxyphenyl]propane and 2,2-bis[4-amino-3-hydroxyphenyl]propane; bis[hydroxyphenyl]hexafluoropropanes such as 2,2-bis[3-amino-4-hydroxyphenyl]hexafluoropropane and 2,2-bis[3-amino-4-hydroxyphenyl]hexafluoropropane; hydroxydiphenyl ethers such as 3,3'-diamino-4,4'-dihydroxydiphenyl ether, 4,4'-diamino-3,3'-dihydroxydiphenyl ether, and 4,4'-diamino-2,2'-dihydroxydiphenyl ether; dihydroxydiphenyl sulfones such as 3,3'-diamino-4,4'-dihydroxydiphenyl sulfone, 4,4'-diamino-3,3'-dihydroxydiphenyl sulfone, and 4,4'-diamino-2,2'-dihydroxydiphenyl sulfone; dihydroxydiphenyl sulfides such as 3,3'-diamino-4,4'-dihydroxydiphenyl sulfide, 4,4'-diamino-3,3'-dihydroxydiphenyl sulfide, and 4,4'-diamino-2,2'-dihydroxydiphenyl sulfide; dihydroxydiphenyl sulfoxides such as 3,3'-diamino-4,4'-dihydroxydiphenyl sulfoxide, 4,4'-diamino-3,3'-dihydroxydiphenyl sulfoxide, and 4,4'-diamino-2,2'-dihydroxydiphenyl sulfoxide; bis[(hydroxyphenyl)phenyl]alkane compounds such as 2,2-bis[4-(4-amino-3-hydroxyphenoxy)phenyl]propane; bis(hydroxyphenoxy)biphenyl compounds such as 4,4'-bis(4-amino-3-hydroxyphenoxy)biphenyl; bis[(hydroxyphenoxy)phenyl]sulfone compounds such as 2,2-bis[4-(4-amino-3-hydroxyphenoxy)phenyl]sulfone; and bis(hydroxyphenoxy)biphenyl compounds such as 4,4'-diamino-3,3'-dihydroxydiphenylmethane, 4,4'-diamino-2,2'-dihydroxydiphenylmethane, 2,2-bis[3-amino-4-carboxyphenyl]propane, and 4,4'-bis(4-amino-3-hydroxyphenoxy)biphenyl. Those compounds can be used solely, or two or more thereof can be used in combination.

The reaction between the tetracarboxylic acid anhydride and the diamino compound can be carried out by any method. For example, the reaction can be carried out by any of the following methods.

Method 1: A solution is prepared in advance by dispersing or dissolving tetracarboxylic acid dianhydride into an organic solvent, and then a diamino compound is added to the solution so as to react the diamino compound with the solution. Thus a polyamide acid solution is prepared. For this reaction, the diamino compound is added so that a total added amount of the diamino compound is in a range from 0.50 mol to 1.50 mol with respect to 1 mol of tetracarboxylic acid dianhydride. After the reaction between the tetracarboxylic acid dianhydride and the diamino compound is completed, a resultant polyamide acid solution is imidized by heating the resultant polyamide acid solution to a temperature of not lower than 100° C. and not higher than 300° C., and more preferably to a temperature of not lower than 150° C. and not higher than 250° C.

Method 2: A polyamide acid solution is prepared by a method that is similar to the method described above in the Method 1. An imidization catalyst (tertiary amine such as pyridine, picoline, isoquinoline, trimethylamine, triethylamine, or tributhylamine is preferably used) and a dehydrating agent (acetic anhydride or the like) are added to the polyamide acid solution, are heated to not lower than 60° C. and not higher than 180° C., thereby being subjected to imidization.

Method 3: A polyamide acid solution is prepared by a method that is similar to the method described above in the Method 1. The polyamide acid solution thus prepared is put into a vacuum oven which has been heated to a temperature of not lower than 100° C. and not higher than 250° C., and is subjected to imidization by heating and drying the polyamide acid solution in the vacuum oven under vacuum.

<(B) Pigment-Containing Cross-Linked Polymer Particles>

The (B) pigment-containing cross-linked polymer particles in accordance with the present invention, are spherical polymer particles, in which pigments are dispersed and whose polymer has a cross-linked structure, having an average particle diameter in a range from 1 µm to 100 µm. The term "spherical" encompass a true spherical shape and an oval shape. An average particle diameter of not larger than 1 µm increases the viscosity and thixotropy of a resultant resin composition for a pigment-containing insulating film. This may cause an appearance defect due to foaming and/or insufficient leveling of a coating film during coating. Meanwhile, an average particle diameter of not less than 100 µm may cause exposure of a particle on a surface of a pigment-containing insulating film, which results in poor surface smoothness of the insulating film.

The average particle diameter of the component (B) in accordance with the present invention is preferably in a range from 1 µm to 50 µm, more preferably in a range from 1 µm to 20 µm. This allows a resultant resin composition for a pigment-containing insulating film to have excellent coating property and allows an insulating film to have excellent smoothness and excellent electrical insulation reliability.

The average particle diameter of the component (B) in accordance with the present invention can be measured, as a median size measured based on volume (which is a particle diameter with respect to 50% of a value of cumulative size distribution), for example, by the following method.

(Measurement of Average Particle Diameter)

Apparatus used: Equivalent of LA-950V2 manufactured by HORIBA, Ltd.

Measurement method: Laser diffraction/scattering

It is preferable that the component (B) in accordance with the present invention have oil absorbency. This preference is because such an arrangement causes the (A) binder polymer, which forms a matrix of a cured film, to seep into the component (B) and thus achieves high adhesiveness at an interface between the component (A) and the component (B).

An amount of oil absorption of the component (B) in accordance with the present invention can be measured, for example, by a boiled linseed oil method, defined in JIS K 5101-13-2, in which the amount of oil absorption is indicated as the number of milliliters of boiled linseed oil with respect to 100 g of particles of the compound (B). The amount of oil absorption of the component (B) is preferably not less than 50 ml/100 g. This is because such an arrangement achieves high adhesiveness at an interface between the (A) binder polymer and the component (B). In a case where the amount of oil absorption of the component (B) is less than 50 ml/100 g, a matrix component insufficiently seeps into the particles of the component (B), and a poor adhesiveness at the interface therefore is caused, which may reduce flexibility of a resultant pigment-containing insulating film. An upper limit of the amount of oil absorption is not particularly limited. However, in a case where the amount of oil absorption is more than 500 ml/100 g, the viscosity of a resultant resin composition for a pigment-containing insulating film becomes high. This may, in some cases, cause an appearance defect due to foaming and/or insufficient leveling of a coating film during coating. Accordingly, it is particularly preferable that the amount of oil absorption of the component (B) is not less than 50 ml/100 g and not more than 500 ml/100 g.

The component (B) of the present invention is not particularly limited. Examples of the component (B) of the present invention encompass pigment-containing cross-linked polyurethane particles, cross-linked acrylic particles, cross-linked acrylic acid alkyl ester copolymer particles, cross-linked methacryl particles, cross-linked methacryl alkyl ester copolymer particles, cross-linked polybutadiene particles, cross-linked polyisoprene particles, and cross-linked silicone particles. These can be used solely, or two or more thereof can be used in combination. Above all, cross-linked polyurethane particles are preferably used because such an arrangement allows a cured film to be reduced in warpage and improved in flexibility of resisting repeated foldings.

A method of preparing the pigment-containing cross-linked polyurethane particles in accordance with the present invention is not particularly limited, but examples of the method encompass a method of (i) preparing a suspension in which polymer particles are dispersed in water by adding a pigment, a polyol component and a polyisocyanate component to water, dispersing these components in particulate form, and reacting these components, and subsequently (ii) separating a liquid from the suspension thus prepared and then drying and solidifying the liquid to obtain polymer particles.

A pigment content in the component (B) of the present invention is preferably in a range from 1% by weight to 70% by weight, more preferably in a range from 1% by weight to 50% by weight because such a pigment content achieves excellent coloring of a resin composition for a pigment-containing insulating film.

The polyol is not particularly limited to any specific one. Examples of the polyol encompass: alkylene diols such as ethyleneglycol, diethylene glycol, propylene glycol, 1,3-butanediol, 1,4-butanediol, 1,5-pentanediol, neopentyl glycol, 3-methyl-1,5-pentanediol, 1,6-hexanediol, 1,8-octanediol, 2-methyl 1,8-octanediol, 1,9-nonanediol, 1,10-decanediol, 1,4-cyclohexanediol, and 1,4-cyclohexanedimethanol; polyoxyalkylene diols such as polyethylene glycol, polypropylene glycol, polytetramethylene glycol, and a random copolymer of tetramethylene glycol and neopentyl glycol; a polyester diol obtained by reacting polyhydric alcohol and polybasic acid; a polycarbonate diol having a carbonate skeleton; a polycaprolactone diol obtained by carrying out ring opening addition of lactones such as γ-butyl lactone, ε-caprolactone, and δ-valerolactone; diols such as bisphenol A, an ethylene oxide adduct of bisphenol A, a propylene oxide adduct of bisphenol A, hydrogenated bisphenol A, an ethylene oxide adduct of hydrogenated bisphenol A, and a propylene oxide adduct of hydrogenated bisphenol A; trifunctional polyols such as glycerol, trimethylolpropane, and 1,2,6-hexanetriol; tetrafunctional polyols such as pentaerythritol; and hexafunctional polyols such as dipentaerythritol. These compounds can be used solely, or two or more thereof can be used in combination.

In a case where a diol is employed as the polyol component, the polyisocyanate component in accordance with the present invention needs to be trifunctional or higher functional polyisocyanate so that the component (B) forms a cross-linked structure. The trifunctional or higher functional polyisocyanate is not particularly limited to any specific one. Examples of such a polyisocyanate encompass isocyanurate type polyisocyanate, biuret type polyisocyanate, and adduct type polyisocyanate. These polyisocyanates can be used solely, or two or more types thereof can be used in combination. Examples of the isocyanurate type polyisocyanate encompass Duranate™ TPA-100 and Duranate™ THA-100 (product names) manufactured by Asahi Kasei Chemicals Corporation. Examples of the biuret type multifunctional polyisocyanate encompass Duranate™ 24A-100 and Duranate™ 22A-75PX (product names) manufactured by Asahi Kasei Chemicals Corporation. Examples of the adduct type multifunctional polyisocyanate encompass Duranate™ P-301-75E and Duranate™ E-402-90T (product names) manufactured by Asahi Kasei Chemicals Corporation. The diisocyanate compound exemplified as a compound for the resin having a (a1) urethane bond can be used in combination, instead of the aforementioned polyisocyanate.

The component (B) in accordance with the present invention is contained in an amount preferably, with respect to 100 parts by weight of the component (A), in a range from 30 parts by weight to 100 parts by weight, and more preferably in a range from 40 parts by weight to 80 parts by weight. This arrangement allows irregularities to be effectively formed at a surface of the pigment-containing insulating film produced, thus allowing the insulating film to have excellent tack property. The above arrangement also allows the component (B) to produce a filling effect, thus decreasing warpage of the cured film. The above arrangement further improves, for example, a stress relaxing effect and fracture toughness of the insulating film, thus improving flexibility of being able to resist repeated foldings. Containing the component (B) in an amount of smaller than 30 parts by weight may cause a decrease in tack-free property and/or flexibility of being able to resist repeated foldings. Containing the component (B) in an amount of larger than 100 parts by weight may (i) cause a decrease in coating property at the time of coating with a resin composition solution for a pigment-containing insulating film, and consequently (ii) cause an appearance defect due to foaming and/or insufficient leveling of a coating film during coating.

A pigment that can be used in the present invention is not limited particularly, and can be one of conventionally known various kinds of pigments. Examples of the pigment encompass a black pigment, a white pigment, a yellow pigment, an orange pigment, a red pigment, a violet pigment, a blue pigment, a green pigment, and a brown pigment. The following discusses, as examples, a black pigment and a white pigment.

(B-1) Black Pigment

The black pigment of the present invention is not particularly limited. Examples of the black pigment of the present invention encompass carbon black, lampblack, graphite, iron oxide, copper oxide, cobalt oxide, nickel oxide, iron-chromium composite oxide, iron-manganese composite oxide, iron-manganese-aluminum composite oxide, iron-cobalt-chromium composite oxide, iron-chromium-manganese composite oxide, iron-cobalt-nickel-manganese composite oxide, copper-chromium composite oxide, copper-chromium-manganese composite oxide, copper-iron-manganese composite oxide, manganese-bismuth composite oxide, manganese-yttrium composite oxide, manganese-strontium composite oxide, an aniline compound, an anthraquinone compound, and perylene compound. These can be used solely, or two or more thereof can be used in combination. Above all, carbon black is preferably used because high coloring and hiding properties can be obtained. The black pigment may be used in a powder form or slurry in which the black pigment is dispersed in water, a solvent or varnish may be prepared and used.

The carbon black of the present invention is not particularly limited. Examples of the carbon black of the present invention encompass #2650, #2600, #2350, #2300, #1000, #980, #970, #960, #950, #900, #850, MCF88, MA600, #750B, #650B, #52, #47, #45, #45L, #44, #40, #33, #32, #30, #25, #20, #10, #5, #95, #85, #260, MA77, MA7, MA8, MA11, MA100, MA100R, MA100S, MA230, MA220, MA14, and #4000B (product names) manufactured by Mitsubishi Chemical Corporation; SEAST9H, SEAST9, SEAST7HM, SEAST6, SEAST600, SEASTKH, SEA-STKH, SEAST3H, SEASTNH, SEAST3, SEASTN, SEAST300, SEAST116HM, SEAST116, SEASTFM, SEASTSO, SEASTV, SEASTSVH, SEASTFY, SEASTS, SEASTSP, SEASTTA, TOKABLACK#8500/F, TOKABLACK#8300/F, TOKABLACK#7550SB/F, TOKABLACK#7400, TOKABLACK#7360SB, TOKABLACK#7350/F, TOKABLACK#7270SB, TOKABLACK#7100/F, and TOKABLACK#7050 (product names) manufactured by TOKAI CARBON CO., LTD.; and Color Black Color Black FW200, Color Black FW2, Color Black FW2V, Color Black FW1, Color Black FW18, Color Black S170, Color Black S160, Special Black 6, Special Black 5, Special Black 4, Special Black 4A, Special Black 550, Special Black 350, Special Black 250, Special Black 100, Special Black 101, Printex 300, Printex 200, Printex 150T, Printex U, Printex V, Printex 140U, Printex 140V, Printex 95, Printex 90, Printex 85, Printex 80, Printex 75, Printex 60, Printex 55, Printex 45, Printex 40, Printex 35, Printex 30, Printex 25, Printex 3, Printex L6, Printex L, Printex ES23, Printex ES22, Printex A, and Printex G. These can be used solely, or two or more thereof can be used in combination.

(B-2) White Pigment

The white pigment of the present invention is not particularly limited. Examples of the white pigment of the present invention encompass titanium oxide, zinc oxide, magnesium oxide, zirconium oxide, aluminum oxide, barium sulfate, silica, talc, mica, aluminum hydroxide, calcium silicate, aluminum silicate, and hollow resin particles. These can be used solely, or two or more thereof can be used in combination. Above all, titanium oxide is preferably used because a high coloring property and reflectance can be obtained, and rutile type titanium dioxide is preferably used because excellent coloring property, hiding property and stability can be obtained.

The rutile type titanium dioxide in the present invention is an oxide of titanium having a diametric crystal structure and is an inorganic compound expressed by the composition formula $TiO_2$. A method for producing the rutile type titanium dioxide is not particularly limited, but can be, for example, a so-called sulfuric acid method of hydrolyzing a titanium sulfate solution and then baking hydrous titanium oxide thus obtained or a so-called chlorine method of vapor-phase oxidizing a titanium halide. In the production step of the titanium oxide by the sulfuric acid method, a compound such as zinc, potassium, aluminum, lithium, niobium or magnesium can be added as a baking treatment agent. In the production step of the titanium oxide by the chlorine method, a compound such as aluminum or potassium may be added as a treatment agent in a process of oxidation of titanium tetrachloride. Especially titanium oxide produced by the chlorine method is preferable because such an arrangement allows a cured film obtained from a photosensitive resin composition to be good in reflectance and hiding property and to be less likely to undergo a color change and a decline in reflectance at high temperature or upon application of light.

Specific examples of the rutile type titanium dioxide encompass, but is not limited to, TIPAQUE R-550, R-580, R-630, R-670, R-680, R-780, R-780-2, R-820, R-830, R-850, R-855, R-930, R-980, CR-50, CR-50-2, CR-57, CR-58, CR-58-2, CR-60, CR-60-2, CR-63, CR-67, CR-Super70, CR-80, CR-85, CR-90, CR-90-2, CR-93, CR-95, CR-953, CR-97, PF-736, PF-737, PF-742, PF-690, PF-691, PF-711, PF-739, PF-740, PC-3, S-305, CR-EL, PT-301, PT-401M, PT-501A, and PT-501R (product names) manufactured by ISHIHARA SANGYO KAISHA, LTD.; R-3L, R-5N, R-7E, R-11P, R-21, R-25, R-32, R-42, R-44, R-45M, R-62N, R-310, R-650, SR-1, D-918, GTR-100, FTR-700, and TCR-52 (product names) manufactured by Sakai Chemical Industry Co., Ltd.; JR, JRNC, JR-301, JR-403, JR-405, JR-600A, JR-600E, JR-603, JR-605, JR-701, JR-800, JR-805, JR-806, JR-1000, MT-01, MT-05, MT-10EX, MT-100S, MT-100TV, MT-100Z, MT-100AQ, MT-100WP, MT-100SA, MT-100HD, MT-150EX, MT-150W, MT-300HD, MT-500B, MT-500SA, MT-500HD, MT-600B, MT-600SA, MT-700B, and MT-700HD (product names) manufactured by TAYCA CORPORATION; KR-310, KR-380, and KR-380N (product names) manufactured by Titan Kogyo, Ltd.; and TR-600, TR-700, TR-750, TR-840, and TR-900 manufactured by Fuji Titanium Industry Co., Ltd. The white pigment may be used in a powder form or may be used in a slurry form in which the white pigment is dispersed in water, a solvent or varnish may be prepared and used.

(B-3) Method for Checking Dispersion of Pigment

It is possible to check by any method a state where cross-linked polymer particles in which the pigment (B) of the present invention is dispersed are contained in an insulating film and the pigment is dispersed inside the cross-linked polymer. One example of such a method is a method of embedding the insulating film in a thermally curing resin, exposing a cross section of the insulating film by polishing the cross section in a thickness direction by ion beams, and observing the cross section of the insulating film by a scanning electron microscope as described below.

<Exposure of Cross Section of Insulating Film>

A 5 mm×3 mm portion of the insulating film is cut out by a cutter. A protective film layer and a cover glass layer are formed on both surfaces (i.e., an insulating-film-side surface and a base-material-side surface) of a laminated body thus cut out with the use of an epoxy embedding resin and cover glass. Then, a cross section of the insulating film in the thickness direction is subjected to cross section polishing processing using ion beams.

<Cross Section Polishing Processing>

Apparatus used: Equivalent of SM-09020CP manufactured by JEOL, Ltd.

Processing condition: acceleration voltage 6 kV

<Observation of Cross Section of Insulating Film>

The cross section of the insulating film in the thickness direction obtained by the above method is observed by a scanning electron microscopy.

<Observation Using Scanning Electron Microscope>

Apparatus used: Equivalent of S-3000N manufactured by Hitachi High-technologies Corporation Observation condition: acceleration voltage 15 kV Detector: reflection electron detection (composition mode)

Magnification: 1000 times

According to the reflection electron detection (composition mode) used, a difference in the average atomic number in an observation region is strongly reflected in contrast. Accordingly, a region where a heavy element is present is observed as a bright (white) region and a region where a light element is present is observed as a dark (black) region. Accordingly, the component (B) which is a spherical organic material constituted by relatively light element such as carbon, hydrogen oxygen, and nitrogen is observed as a dark (black) circular region. Meanwhile, in a case where a pigment containing a relatively heavy element such as iron, copper, cobalt, nickel, chromium, manganese, aluminum, bismuth or titanium is dispersed inside the component (B), the pigment is observed as a darkish (e.g. gray) or bright (white) minute region inside the circular region of the component (B).

Moreover, by analyzing the region of the component (B) in the cross section of the insulating film in the thickness direction by a scanning electron microscope-X-ray micro analyzer (SEM-EPMA), information on elements contained in the component (B) can be obtained. It is thus possible to confirm that the pigment is contained.

<Analysis Using Scanning Electron Microscope-X-Ray Micro Analyzer>

Apparatus used: Equivalent of EMAX-7000 manufactured by HORIBA, Ltd.

Analysis condition: acceleration voltage 15 kV, integration time 900 seconds

<(C) Thermosetting Resin>

The "(C) thermosetting resin" in accordance with the present invention is a compound having at least one thermosetting organic group in its molecule.

The component (C) in accordance with the present invention is not particularly limited as long as it has the above structure. Examples of the component (C) encompass: epoxy resin; oxetane resin; phenol resin; isocyanate resin; block isocyanate resin; bismaleimide resin; bisallylnadiimide resin; polyester resin (e.g., unsaturated polyester resin); diallylphthalate resin; silicon resin; venylester resin; melamine resin; polybismaleimide triazine resin (BT resin); cyanate resin (e.g., cyanate ester resin); urea resin; guanamine resin; sulfonamide resin; aniline resin; polyurea resin; thiourethane resin; polyazomethine resin; episulphide resin; enethiol resin; benzoxazine resin; copolymer resins thereof; modified resins thereof, which are prepared by modifying those resins; and mixtures of those resins or mixtures of one or more resins with (an)other resin(s).

Among the above thermosetting resins, it is particularly preferable to use epoxy resin as the component (C) in accordance with the present invention. This is because the epoxy resin can impart, to a pigment-containing insulating film, not only a heat resistance but also adhesiveness with respect to (i) a conductor (such as metallic foil) and (ii) a circuit substrate.

The above epoxy resin is a compound having at least one epoxy group in its molecule, and the above epoxy resin is not particularly limited to any specific one. Examples of the bisphenol A type epoxy resins encompass: jER 828, jER 1001, and jER 1002 (trade names) manufactured by Japan Epoxy Resins Co., Ltd.; ADEKA RESIN EP-4100E and ADEKA RESIN EP-4300E (trade names) manufactured by ADEKA Corporation; RE-3105 and RE-4105 (trade names) manufactured by Nippon Kayaku Co., Ltd.; EPICLON 840S, EPICLON 850S, EPICLON 1050, and EPICLON 7050 (trade names) manufactured by Dainippon Ink and Chemicals Inc.; and EPOTOHTO YD-115, EPOTOHTO YD-127, and EPOTOHTO YD-128 (trade names) manufactured by Tohto Kasei Co., Ltd. Examples of the bisphenol F type epoxy resins encompass: jER 806 and jER 807 (trade names) manufactured by Japan Epoxy Resins Co., Ltd.; ADEKA RESIN EP-4901E, ADEKA RESIN EP-4930, and ADEKA RESIN EP-4950 (trade names) manufactured by ADEKA Corporation; RE-3035, RE-3045, RE-4035, and RE-404S (trade names) manufactured by Nippon Kayaku Co., Ltd.; EPICLON 830 and EPICLON 835 (trade names) manufactured by Dainippon Ink and Chemicals Inc.; and EPOTOHTO YDF-170, EPOTOHTO YDF-175S, and EPOTOHTO YDF-2001 (trade names) manufactured by Tohto Kasei Co., Ltd. Examples of the bisphenol S type epoxy resins encompass EPICLON EXA-1514 (trade name) manufactured by Dainippon Ink and Chemicals Inc. Examples of the hydrogenated bisphenol A type epoxy resins encompass: jERYX 8000, jERYX 8034, and jERYL 7170 (trade names) manufactured by Japan Epoxy Resins Co., Ltd.; ADEKA RESIN EP-4080E (trade name) manufactured by ADEKA Corporation; EPICLON EXA-7015 (trade name) manufactured by Dainippon Ink and Chemicals Inc.; and EPOTOHTO YD-3000 and EPOTOHTO YD-4000D (trade names) manufactured by Tohto Kasei Co., Ltd. Examples of the biphenyl type epoxy resins encompass: jERYX 4000, jERYL 6121H, jERYL 6640, and jERYL 6677 (trade names) manufactured by Japan Epoxy Resins Co., Ltd.; and NC-3000 and NC-3000H (trade names) manufactured by Nippon Kayaku Co., Ltd. Examples of the phenoxy type epoxy resins encompass jER 1256, jER 4250, and jER 4275 (trade names) manufactured by Japan Epoxy Resins Co., Ltd. Examples of the naphthalene type epoxy resins encompass: EPICLON HP-4032, EPICLON HP-4700, and EPICLON HP-4200 (trade names) manufactured by Dainippon Ink and Chemicals Inc.; and NC-7000L (trade name) manufactured by Nippon Kayaku Co., Ltd. Examples of the phenol novolac type epoxy resins encompass: jER 152 and jER 154 (trade names) manufactured by Japan Epoxy Resins Co., Ltd.; EPPN-201-L (trade name) manufactured by Nippon Kayaku Co., Ltd.; EPICLON N-740 and EPICLON N-770 (trade names) manufactured by Dainippon Ink and Chemicals Inc.; and EPOTOHTO YDPN-638 (trade name) manufactured by Tohto Kasei Co., Ltd. Examples of the cresol novolac type epoxy resins encompass: EOCN-1020, EOCN-102S, EOCN-103S, and EOCN-104S (trade names) manufactured by Nippon Kayaku Co., Ltd.; and EPICLON N-660, EPICLON N-670, EPICLON N-680, and EPICLON N-695 (trade names) manufactured by Dainippon Ink and Chemicals Inc. Examples of the trisphenolmethane type epoxy resins encompass EPPN-501H, EPPN-501HY, and EPPN-502H (trade names) manufactured by Nippon Kayaku Co., Ltd. Examples of the dicyclopentadiene type epoxy resins encompass: XD-1000 (trade name) manufactured by Nippon Kayaku Co., Ltd.; and EPICLON HP-7200 (trade name) manufactured by Dainippon Ink and Chemicals Inc. Examples of the amine type epoxy resins encompass: jER 604 and jER 630 (trade names) manufactured by Japan Epoxy Resins Co., Ltd.; EPOTOHTO YH-434 and EPOTOHTO YH-434L (trade names) manufactured by Tohto Kasei Co., Ltd.; and TETRAD-X and TERRAD-C (trade names) manufactured by Mitsubishi Gas Chemical Co., Inc. Examples of the flexible epoxy resins encompass: jER 871, jER 872, jERYL 7175, and jERYL 7217 (trade names) manufactured by Japan Epoxy Resins Co., Ltd.; and EPICLON EXA-4850 (trade name) manufactured by Dainippon Ink and Chemicals Inc. Examples of the urethane-denatured epoxy resins encompass: ADEKA RESIN EPU-6, ADEKA RESIN EPU-73, and ADEKA RESIN EPU-78-11 (trade names) manufactured by ADEKA Corporation. Examples of the rubber-denatured epoxy resins encompass: ADEKA RESIN EPR-4023, ADEKA RESIN EPR-4026, and ADEKA RESIN EPR-1309 (trade names) manufactured by ADEKA Corporation. Examples of the chelate-denatured epoxy resins encompass ADEKA RESIN EP-49-10 and ADEKA RESIN EP-49-20 (trade names) manufactured by ADEKA Corporation. Examples of the heterocycle-containing epoxy resins encompass TEPIC (triglycidylisocyanurate) (trade name) manufactured by Nissan Chemical Industries, Ltd. These resins can be used solely, or two or more types thereof can be used in combination.

A curing agent contained in the resin composition for a pigment-containing insulating film in accordance with the present invention and used for the thermosetting resin is not particularly limited to any specific one. Examples of the curing agent encompass: a phenolic resin such as phenol novolac resin, cresol novolac resin, and naphthalene type phenolic resin; amino resin; urea resin; melamine; and dicyandiamide. These curing agents can be used solely, or two or more types thereof can be used in combination.

A curing accelerator is not particularly limited to any specific one. Examples of the curing accelerator encompass: phosphine-based compounds such as triphenylphosphine; amine-based compounds such as tertiary amine, trimethanolamine, triethanolamine, and tetraethanolamine; borate-based compounds such as 1,8-diaza-bicyclo[5,4,0]-7-undecenium tetraphenylborate; imidazoles such as imidazole, 2-ethyl imidazole, 2-ethyl-4-methyl imidazole, 2-phenyl imidazole, 2-undecyl imidazole, 1-benzyl-2-methyl imidazole, 2-heptadecylimidazole, 2-isopropyl imidazole, 2,4-dimethyl imidazole, and 2-phenyl-4-methyl imidazole; imidazolines such as 2-methyl imidazoline, 2-ethyl imidazoline, 2-isopropyl imidazoline, 2-phenyl imidazoline, 2-undecylimidazoline, 2,4-dimethyl imidazoline, and 2-phenyl-4-methyl imidazoline; azine-based imidazoles such as 2,4-diamino-6-[2'-methylimidazolyl-(1')]-ethyl-s-triazine, 2,4-diamino-6-[2'-undecylimidazolyl-(1')]-ethyl-s-triazine, and 2,4-diamino-6-[2'-ethyl-4'-methylimidazolyl-(1')]-ethyl-s-triazine. These curing accelerators can be used solely, or two or more types thereof can be used in combination.

<(D) Compound Having a Radically Polymerizable Group in its Molecule>

The compound (D) having a radically polymerizable group in its molecule, in accordance with the present invention, is a compound containing at least one radically polymerizable group, in its molecule, of which a polymerization reaction proceeds with use of a radical polymerization initiator. Among the above compounds, a compound in which the radically polymerizable group has unsaturated double bond is preferable. Further, the unsaturated double bond is preferably a (meth)acryloyl group or a vinyl group. The use of the compound (D) having a radically polymerizable group in its molecule allows a resin composition for an insulating film in accordance with the present invention to be a photosensitive resin composition for an insulating film. This makes it possible to subject the resin composition for an insulating film to microfabrication by light exposure and development.

The compound (D) having a radically polymerizable group in its molecule is not particularly limited to any specific one. Examples of such a compound encompass radically polymerizable monomers including: bisphenol F EO-denatured (n=2 to 50) diacrylate; bisphenol A EO-denatured (n=2 to 50) diacrylate; bisphenol S EO-denatured (n=2 to 50) diacrylate; bisphenol F EO-denatured (n=2 to 50) dimethacrylate; bisphenol A EO-denatured (n=2 to 50) dimethacrylate; bisphenol S EO-denatured (n=2 to 50) dimethacrylate; 1,6-hexanediol diacrylate; neopentyl glycol diacrylate; ethylene glycol diacrylate; pentaerythritol diacrylate; trimethylolpropane triacrylate; pentaerythritol triacrylate; dipentaerythritol hexaacyrlate; tetramethylolpropane tetraacrylate; tetraethylene glycol diacrylate; 1,6-hexanediol dimethacrylate; neopentyl glycol dimethacrylate; ethylene glycol dimethacrylate; pentaerythritol dimethacrylate; trimethylolpropane trimethacrylate; pentaerythritol trimethacrylate; dipentaerythritol hexamethacrylate; tetramethylolpropane tetramethacrylate; tetraethylene glycol dimethacrylate; methoxy diethylene glycol methacrylate; methoxy polyethylene glycol methacrylate; β-methacryloyloxyethyl hydrogen phthalate; β-methacryloyloxyethyl hydrogen succinate; 3-chloro-2-hydroxypropyl methacrylate; stearyl methacrylate; phenoxyethyl acrylate; phenoxydiethylene glycol acrylate; phenoxypolyethylene glycol acrylate; β-acryloyloxyethyl hydrogen succinate; lauryl acrylate; ethylene glycol dimethacrylate; diethylene glycol dimethacrylate; triethylene glycol dimethacrylate; polyethylene glycol dimethacrylate; 1,3-butylene glycol dimethacrylate; 1,6-hexanediol dimethacrylate; neopentyl glycol dimethacrylate; polypropylene glycol dimethacrylate; 2-hydroxy-1,3-dimethacryloxypropane; 2,2-bis[4-(methacryloxyethoxy)phenyl]propane; 2,2-bis[4-(methacryloxy diethoxy)phenyl]propane; 2,2-bis[4-(methacryloxy polyethoxy)phenyl]propane; polyethylene glycol diacrylate; tripropylene glycol diacrylate; polypropylene glycol diacrylate; 2,2-bis[4-(acryloxy diethoxy)phenyl]propane; 2,2-bis[4-(acryloxy polyethoxy)phenyl]propane; 2-hydroxy-1-acryloxy-3-methacryloxypropane; trimethylolpropane trimethacrylate; tetramethylolmethane triacrylate; tetramethylolmethane tetraacrylate; methoxydipropylene glycol methacrylate; methoxytriethylene glycol acrylate; nonylphenoxypolyethylene glycol acrylate; nonylphenoxypolypropylene glycol acrylate; 1-acryloyloxypropyl-2-phthalate; isostearyl acrylate; polyoxyethylenealkyl ether acrylate; nonylphenoxyethylene glycol acrylate; polypropylene glycol dimethacrylate; 1,4-butanediol dimethacrylate; 3-methyl-1,5-pentanediol dimethacrylate; 1,6-mexanediol dimethacrylate; 1,9-nonanediol methacrylate; 2,4-diethyl-1,5-pentanediol dimethacrylate; 1,4-cyclohexane dimethanol dimethacrylate; dipropylene glycol diacrylate; tricyclodecane dimethanol diacrylate; 2,2-hydrogenated bis[4-(acryloxy polyethoxy)phenyl]propane; 2,2-bis[4-(acryloxy polypropoxy)phenyl]propane; 2,4-diethyl-1,5-pentanediol diacrylate; ethoxylated trimethylolpropane triacrylate; propoxylated trimethylolpropane triacrylate; isocyanuric acid tri(ethane acrylate); pentathritol tetraacrylate; ethoxylated pentathritol tetraacrylate; propoxylated pentathritol tetraacrylate; ditrimethylolpropane tetraacrylate; dipentaerythritol polyacrylate; triallyl isocyanurate; glycidyl methacrylate; glycidyl allyl ether; 1,3,5-triacryloylhexahydro-s-triazine; triallyl 1,3-5-benzenecarboxylate; triallylamine; triallyl citrate; triallyl phosphate; allobarbital; diallylamine; diallyl dimethyl silane; diallyl disulfide; diallyl ether; diallyl cyanurate; diallyl isophthalate; diallyl terephthalate; 1,3-diallyloxy-2-propanol; diallyl sulfide diallyl maleate; 4,4'-isopropylidene diphenol dimethacrylate; and 4,4'-isopropylidene diphenol diacrylate. These compounds can be used solely, or two or more types thereof can be used in combination. In particular, a compound containing 2 to 50 mol of a repeating unit of EO (ethylene oxide) in a single molecule of diacrylate or dimethacrylate is preferable because this arrangement (i) improves solubility of the resultant resin composition for a pigment-containing insulating film in an aqueous developing solution (which is typically represented by an alkaline aqueous solution) and (ii) reduces the developing time.

Alternatively, the compound having a radically polymerizable group in its molecule can be, for example, acid-modified epoxy acrylate. The acid-modified epoxy acrylate is obtained by adding saturated or unsaturated polyvalent carboxylic acid anhydride to a reactant which is obtained by reacting an epoxy compound with unsaturated monocarboxylic acid. Further alternatively, the compound having a radically polymerizable group in its molecule can be urethane acrylate which is a polymer of (i) a diol compound having an unsaturated ethylene group and/or a carboxyl group and (ii) a diisocyanate compound. Still further alternatively, the compound having a radically polymerizable group in its molecule can be a resin containing a radically polymerizable group, such as an acrylated acrylate, obtained by copolymerizing (i) a (meth)acrylic acid having a carboxyl group and a double bond capable of copolymerization and (ii) a (meth)acrylic ester or the like to obtain a copolymer, and then reacting a part of the carboxyl groups on a side chain of the copolymer with an epoxy group which is contained in a compound, such as glycidyl methacrylate, having a (meth)acrylic group and the epoxy group. Examples of the epoxy acrylate encompass ZFR series, ZAR series, ZCR series, CCR series, and PCR series each of which is manufactured by Nippon Kayaku Co., Ltd. Examples of the urethane acrylate encompass UXE series produced by Nippon Kayaku Co., Ltd. Examples of the acrylated acrylate encompass Cyclomer ACA series produced by DAICEL-CYTEC Company Ltd. The resin containing a radically polymerizable group may be used solely or may be used in combination with the radically polymerizable monomer.

<(E) Photo-Polymerization Initiator>

The (E) photo-polymerization initiator in accordance with the present invention is a compound that is activated by energy such as UV energy and that starts and accelerates a reaction of a radically polymerizable group. The use of the (E) photo-polymerization initiator in combination with the compound (D) having a radically polymerizable group in its molecule allows a resin composition for an insulating film in accordance with the present invention to be a photosensitive resin composition for an insulating film. This makes it possible to subject the resin composition for an insulating film to microfabrication by light exposure and development.

The component (E) in the present invention is not particularly limited to any specific one as long as it has the aforementioned structure. Examples of the component (E) encompass: Michler's ketone; 4,4'-bis(diethylamino)benzophenone; 4,4',4"-tris(dimethylamino)triphenylmethane; 2,2'-bis(2-chlorophenyl)-4,4',5,5'-tetraphenyl-1,2'-diimidazole; acetophenone; benzoin; 2-methylbenzoin; benzoin methyl ether; benzoin ethyl ether; benzoin isopropyl ether; benzoin isobutyl ether; 2-t-butylanthraquinone; 1,2-benzo-9,10-anthraquinone; methylanthraquinone; thioxanthone; 2,4-diethylthioxanthone; 2-isopropylthioxanthone; 1-hydroxycyclohexyl phenyl ketone; diacetylbenzyl; benzyl dimethyl ketal; benzyl diethyl ketal; 2(2'-furilethylidene)-4, 6-bis(trichloromethyl)-S-triazine; 2[2'(5"-methylfurifiethylidene]-4,6-bis(trichloromethyl)-S-triazine; 2(p-methoxyphenyl)-4,6-bis(trichloromethyl)-S-triazine; 2,6-di(p-azidobenzal)-4-methylcyclohexanone; 4,4'-diazidochalcon; di(tetraalkylammonium)-4,4'-diazidostilbene-2,2'-disulfonate; 2,2-dimethoxy-1,2-diphenylethane-1-one; 1-hydroxy-cyclohexyl-phenyl-ketone; 2-hydroxy-2-methyl-1-phenyl-propane-1-one; 1-[4-(2-hydroxyethoxy)-phenyl]-2-hydroxy-2-methyl-1-propane-1-one; 2-methyl-1-[4-(methylthio)phenyl]-2-morpholinopropane-1-one; 2-benzyl-2-dimethylamino-1-(4-morpholinophenyl)-butane-1; bis(2,4,6-trimethylbenzoyl)-phenylphosphine oxide; bis(2,6-dimethoxybenzoyl)-2,4,4-trimethyl-pentylphosphine oxide; 2,4,6-trimethylbenzoyl-diphenyl-phosphine oxide; 2-hydroxy-2-methyl-1-phenyl-propane-1-ketone; bis(n5-2,4-cyclopentadiene-1-yl)-bis(2,6-difluoro-3-(1H-pyrrole-1-yl)-phenyl)titanium; 1,2-octanonedione; 1-[4-(phenylthio)-2-(O-benzoyloxime)]; iodonium; (4-methylphenyl)[4-(2-methylpropyl)phenyl]-hexafluorophosphate(1-); ethyl-4-dimethylaminobenzoate; 2-ethylhexyl-4-dimethylaminobenzoate; ethanone; and 1-[9-ethyl-6-(2-methylbenzoyl)-9H-carbazol-3-yl]-1-(O-acetyloxime). These compounds can be used solely, or two or more types thereof can be used in combination.

<(F) Phosphoric Flame Retardant>

The (F) phosphoric flame retardant in accordance with the present invention is a compound that contains at least one elemental phosphorus in its molecule and has an effect of suppressing burning of organic matter.

The component (F) in accordance with the present invention is not particularly limited to any specific one as long as it has the above structure. Examples of the component (F) encompass red phosphorus, a condensed phosphoric ester compound, a cyclic organic phosphorus compound, a phosphazene compound, a phosphorus-containing (meth)acrylate compound, a phosphorus-containing epoxy compound, a phosphorus-containing polyol compound, a phosphorus-containing amine compound, polyphosphate ammonium, melamine phosphate, and phosphinate. These components can be used solely, or two or more thereof can be used in combination.

The component (F) in accordance with the present invention is preferably phosphinate in particular, among the above phosphoric flame retardants. This arrangement makes it possible to impart excellent flame retardancy to a resultant pigment-containing insulating film and causes only a little bleedout from the pigment-containing insulating film, thus making it possible to prevent a contact fault and pollution during a process.

The phosphinate in accordance with the present invention is a compound represented by General Formula (7):

General Formula (7)

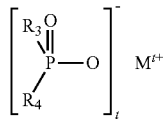

where, $R_3$ and $R_4$ each independently represent a linear or branched alkyl group or aryl group having 1 to 6 carbon atoms; M represents at least one metal selected from the group consisting of Mg, Ca, Al, Sb, Sn, Ge, Ti, Fe, Zr, Zn, Ce, Bi, Sr, Mn, Li, Na, and K; and t represents an integer of 1 to 4.

The phosphinate in accordance with the present invention is not particularly limited to any specific one as long as it has the aforementioned structure. Examples of the phosphinate encompass: aluminum trisdiethylphosphinate; aluminum trismethylethylphosphinate; aluminum trisdiphenylphosphinate; zinc bisdiethylphosphinate; zinc bismethylethylphosphinate; zinc bisdiphenylphosphinate; titanyl bisdiethylphosphinate; titanyl bismethylethylphosphinate; and titanyl bisdiphenylphosphinate. These phosphinates can be used solely, or two or more types thereof can be used in combination. Among the above phosphinates, aluminum trisdiethylphosphinate or aluminum trismethylethylphosphinate is preferable in particular because such an arrangement can achieve high flame retardancy.

The component (F) in accordance with the present invention is contained in an amount preferably, with respect to 100 parts by weight of the component (A), in a range from 5 parts by weight to 100 parts by weight, and more preferably in a range from 10 parts by weight to 50 parts by weight. This arrangement allows an obtained pigment-containing insulating film to be excellent in flame retardancy and electrical insulation reliability. Containing the component (F) in an amount of smaller than 5 parts by weight may cause a decrease in flame retardancy. Containing the component (F) in an amount of larger than 100 parts by weight may (i) causes a decrease in folding endurance, (ii) cause a decrease in coating property at the coating of a resin composition for a pigment-containing insulating film, and consequently (iii) cause an appearance defect due to foaming and/or insufficient leveling of a coating film during coating.

<Other Components>

The resin composition for a pigment-containing insulating film in accordance with the present invention can further contain, as necessary, various additives such as a filler, an adhesion promoting agent, a defoaming agent, a leveling agent, a coloring agent, and a polymerization inhibitor.

Example of the filler encompass fine inorganic fillers such as silica, mica, talc, barium sulfate, wollastonite, and calcium carbonate.

Examples of the defoaming agent encompass acryl-based compounds, vinyl-based compounds, and butadiene-based compounds.

Examples of the leveling agent encompass an acryl-based compound and a vinyl-based compound.

Examples of the coloring agent encompass a phthalocyanine-based compound, an azo-based compound, and carbon black.

Examples of the adhesion promoting agent (also called an adhesion promoter) encompass a silane coupling agent, a triazole-based compound, a tetrazole-based compound, and a triazine-based compound.

Examples of the polymerization inhibitor encompass hydroquinone and hydroquinone monomethylether.

The resin composition for a pigment-containing insulating film in accordance with the present invention may contain a flame retardant to obtain a higher flame retardant effect. Examples of the flame retardant encompass a halogen-based compound, a metal hydroxide, and a melamine-based compound. Those various additives can be used solely, or two or more types thereof can be used in combination.

<Method of Mixing Resin Composition for Pigment-Containing Insulating Film>

It is possible to prepare the resin composition for a pigment-containing insulating film in accordance with the present invention by grinding and dispersing the components (A) through (F) and (an)other component(s) and then mixing them. A method of grinding and dispersing those components is not particularly limited, and is carried out with use of, for example, a general kneading machine such as a beads-mill, a ball mill, or a triple-roll mill. It is particularly preferable to use the beads-mill to grind and disperse the components to mix them because a particle size distribution of the component (B), which exists as fine particles, becomes uniform.

The following is an example of grinding and dispersing with use of a beads-mill. The components (A) through (F) and (an)other component(s), and a solvent as necessary are mixed with one another to obtain a mixture. Subsequently, beads are added to the mixture thus obtained. A resultant mixture is agitated with use of a predetermined device and then sheared. In this manner, fine particles can be ground and dispersed for mixture. Examples of the kinds of the above beads encompass zirconia, zircon, glass, and titania. However, from among these beads, beads suitable for a target particle diameter and for an intended use may be employed. A particle diameter of the beads is not particularly limited to any specific one, and beads suitable for a target particle diameter may be employed. An agitating speed (circumferential speed) varies by device. However, the mixture may be agitated at a rate of 100 rpm to 3000 rpm. If the agitating speed becomes higher, a temperature will be raised. In such a case, the rise in temperature of the mixture may be suppressed by flowing cooling water or a coolant as appropriate. When the component (B) obtains a desired particle diameter, the beads are then filtered. Thus, the resin composition for a pigment-containing insulating film in accordance with the present invention can be prepared. The particle diameter of the fine particles can be measured by a method involving a gauge which is defined by JIS K 5600-2-5. Further, with use of a particle size distribution measurement device, it is possible to measure an average particle diameter, a particle diameter, and a particle size distribution.

(II) Method of Using Resin Composition for Pigment-Containing Insulating Film

The resin composition for a pigment-containing insulating film in accordance with the present invention can be directly formed into a pigment-containing insulating film, or can be formed into a pigment-containing insulating film after the preparation of a resin composition solution for a pigment-containing insulating film, in the following manner. Initially, the resin composition or the resin composition solution is applied to a substrate and then dried so as to remove an organic solvent. The application of the resin composition or the resin composition solution to the substrate may be carried out by screen printing, curtain rolling, reverse rolling, spray coating, rotational application by use of a spinner, or the like. A coating film as applied (having a thickness preferably in a range from 5 µm to 100 µm, particularly preferably in a range from 10 µm to 100 µm) is dried at a temperature of not higher than 120° C., preferably at a temperature in a range from 40° C. to 100° C.

Next, the coating film thus obtained is subjected to a heat treatment. By carrying out the heat treatment, and then reacting residual reactive groups with each other in a molecular structure, it is possible to prepare a pigment-containing insulating film having excellent heat resistance. A thickness of the pigment-containing insulating film is determined in consideration of a thickness of wiring lines and the like, but is preferably in a range from about 2 µm to 50 µm. As for a final curing temperature in the heat treatment, it is desirable that the film be cured by heating at a low temperature so as to prevent (i) oxidization of the wiring lines and the like and (ii) decrease in adhesiveness of the wiring lines to a base material.

The curing temperature in the heat treatment is preferably not lower than 100° C. and not higher than 250° C., further preferably not lower than 120° C. and not higher than 200° C., particularly preferably not lower than 130° C. and not higher than 180° C. It is not preferable that a final heat temperature be high, because deterioration of the wiring lines due to oxidation is promoted.

The following will describe a method of using the resin composition for a pigment-containing insulating film in accordance with the present invention in a case where the resin composition for a pigment-containing insulating film in accordance with the present invention is a photosensitive resin composition which contains one of the compound (D) having a radically polymerizable group in its molecule and the (E) photo-polymerization initiator.

The resin composition for a pigment-containing insulating film in accordance with the present invention can be directly formed into a pigment-containing insulating film or can be formed into a pigment-containing insulating film after the preparation of a resin composition solution for a pigment-containing insulating film, in the following manner. Initially, the resin composition or the resin composition solution is applied to a substrate and then dried so as to remove an organic solvent. The application of the resin composition or the resin composition solution to the substrate may be carried out by screen printing, curtain rolling, reverse rolling, spray coating, rotational application by use of a spinner, or the like. A coating film as applied (having a thickness preferably in a range from 5 µm to 100 µm, particularly preferably in a range from 10 µm to 100 µm) is dried at a temperature of not higher than 120° C., preferably at a temperature in a range from 40° C. to 100° C.

After the coating film is dried, a negative photomask is placed on the coating film thus dried, and is irradiated with active light such as ultraviolet rays, visible light, or electron beams. Then, a portion, in the coating film, which is not exposed to light is washed with a developing solution by a method such as a shower method, a paddle method, a soaking method, an ultrasonic method, or the like method so as to form a relief pattern. Since a time required for the pattern to be exposed differs depending on spray pressure and flow speed of the developing device, and a temperature of the etching solution, it is desirable to find an optimum condition for the device as appropriate.

As the developing solution, an alkaline aqueous solution is preferably used. The developing solution may contain a water-soluble organic solvent such as methanol, ethanol, n-propanol, isopropanol, or N-methyl-2-pyrrolidone. Examples of alkaline compounds for use in preparation of the alkaline aqueous solution encompass hydroxides, carbonates, hydrogencarbonates, or amine compounds of alkaline metals, alkaline earth metals, or ammonium ion, for example. More specifically, examples of the alkaline compounds encompass sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, and triisopropylamine. Further, any other compounds are obviously usable as long as the aqueous solution exhibits basicity. The alkaline compound preferably used in the step of developing the resin composition for a pigment-containing insulating film in accordance with the present invention has a concentration preferably in a range from 0.01% by weight to 20% by weight, particularly preferably in a range from 0.02% by weight to 10% by weight. A temperature of the developing solution depends on a composition of the resin composition for a pigment-containing insulating film or a composition of the alkaline developing solution. Generally, the temperature of the developing solution is preferably not lower than 0° C. and not higher than 80° C., and more preferably not lower than 10° C. and not higher than 60° C.

The relief pattern thus formed in the developing step is rinsed to remove unnecessary residues of the developing solution. Examples of a rinsing solution for use in the rinsing encompass water and an acidic aqueous solution.

Next, the coating film thus obtained is subjected to a heat treatment. By carrying out the heat treatment, and then reacting residual reactive groups with each other in a molecular structure, it is possible to prepare a pigment-containing insulating film having excellent heat resistance. A thickness of the pigment-containing insulating film is determined in consideration of a thickness of wiring lines and the like, but is preferably in a range from about 2 μm to 50 μm. As for a final curing temperature in the heat treatment, it is desirable that the film be cured by heating at a low temperature so as to prevent (i) oxidization of the wiring lines and the like and (ii) decrease in adhesiveness of the wiring lines to a base material.

The curing temperature in the heat treatment is preferably not lower than 100° C. and not higher than 250° C., further preferably not lower than 120° C. and not higher than 200° C., particularly preferably not lower than 130° C. and not higher than 180° C. It is not preferable that a final heat temperature be high, because deterioration of the wiring lines due to oxidation is promoted in such a case.

A pigment-containing insulating film formed from the resin composition for a pigment-containing insulating film in accordance with the present invention has excellent flexibility and excellent electrical insulation reliability, and a substrate upon curing is small in warpage.

In addition, the pigment-containing insulating film prepared from the resin composition for a pigment-containing insulating film suitably has, for example, a film thickness in a range from about 2 μm to 50 μm. The insulating film is thus particularly suitable as an insulating material for a flexible circuit board. The resin composition for a pigment-containing insulating film can be further used for any of various wiring line coating protective agents, heat-resistant adhesives, and electric wire/cable insulating coatings.

Note that the present invention can provide a similar insulating material with use of a resin film that is obtained by applying the resin composition for a pigment-containing insulating film or the resin composition solution for a pigment-containing insulating film to a surface of a base material and drying the surface.

EXAMPLES

The following more specifically describes Examples of the present invention. However, the present invention is not limited to Examples as below.

Synthesis Example 1

<(A) Binder Polymer 1>

Into a reaction vessel equipped with a stirrer, a thermometer, and a nitrogen-inlet tube, 25.00 g of methyl triglyme (1,2-bis(2-methoxyethoxy)ethane) was poured as a solvent for polymerization. Then, 5.16 g (0.024 mol) of norbornene diisocyanate was added thereto, and a mixture was heated to 80° C., while being stirred under nitrogen stream, so that the norbornene diisocyanate was dissolved in the solvent. To a resultant solution, a solution (a) in which 50.0 g (0.025 mol) of polycarbonate diol (manufactured by Asahi Kasei Chemicals Corporation, product name: PCDL T5652, a weight-average molecular weight of 2000) was dissolved into 25.00 g of methyl triglyme, was added over 1 hour. A mixture solution thus obtained was stirred under heating at 80° C. for 5 hours for reaction. As a result of the reaction, a resin solution containing a urethane bond in its molecule was obtained. The resin solution thus obtained had a solid content concentration of 53% and a weight-average molecular weight of 5,600. Measurements of the solid content concentration and the weight-average molecular weight were carried out by the methods as below.

<Solid Content Concentration>

Measurement of the solid content concentration was carried out in accordance with JIS K 5601-1-2. As a drying condition, a condition of 170° C. for 1 hour was selected.

<Weight-Average Molecular Weight>

The measurement was carried out under the following conditions.

Apparatus used: equivalent of HLC-8220GPC manufactured by TOSOH Corporation
Column: TSK gel Super AWM-H manufactured by TOSOH Corporation (6.0 mm I.D.×15 cm) (2 columns)
Guard column: TSK guard column Super AW-H manufactured by TOSOH Corporation
Carrier: 30 mM LiBr+20 mM $H_3PO_4$ in DMF
Flow speed: 0.6 mL/min
Column temperature: 40° C.
Detection conditions: RI: polarity (+), response (0.5 sec)
Sample concentration: approximately 5 mg/mL
Reference standard: PEG (polyethylene glycol).

Synthesis Example 2

<(A) Binder Polymer 2>

Into a reaction vessel equipped with a stirrer, a thermometer, and a nitrogen-inlet tube, 30.00 g of methyl triglyme (1,2-bis(2-methoxyethoxy)ethane) was poured as a solvent for polymerization. Then, 10.31 g (0.050 mol) of norbornene diisocyanate was added thereto, and a mixture was heated to 80° C., while being stirred under nitrogen stream, so that the norbornene diisocyanate was dissolved in the solvent. To a resultant solution, a solution in which (i) 50.0 g (0.025 mol) of polycarbonate diol (manufactured by Asahi Kasei Chemicals Corporation, product name: PCDL T5652, a weight-average molecular weight of 2000) and (ii) 3.70 g (0.025 mol) of 2,2-bis(hydroxymethyl) butanoic acid were dissolved into 30.00 g of methyl triglyme, was added over 1 hour. A mixture solution thus obtained was stirred under heating at 80° C. for 5 hours for reaction. As a result of the reaction, a resin solution containing, in its molecule, a urethane bond and a carboxyl group was obtained. A resin solution thus obtained had a solid content concentration of 52%, a weight-average molecular weight of 5,600, and an acid number of 22 mg KOH/g based on a solid content. Measurements of the solid content concentration and the weight-average molecular weight were carried out by the same methods as in Synthesis Example 1, and measurement of the acid number was carried out by the method as below.

<Acid Number>

Measurement of the acid number was carried out in accordance with JIS K 5601-2-1.

Synthesis Example 3

<(A) Binder Polymer 3>

Into a reaction vessel equipped with a stirrer, a thermometer, a dropping funnel, and a nitrogen-inlet tube, 100.00 g of methyl triglyme (1,2-bis(2-methoxyethoxy)ethane) was poured as a solvent for polymerization and was then heated to 80° C. while being stirred under nitrogen stream. To the solvent thus heated, a mixed solution prepared by mixing, in advance at room temperature, 12.00 g (0.14 mol) of methacrylic acid, 28.00 g (0.16 mol) of benzyl methacrylate, 60.00 g (0.42 mol) of butyl methacrylate, and 0.50 g of azobisisobtyronitri that serves as a radical polymerization initiator, was added dropwise over 3 hours with the dropping funnel while being heated at 80° C. After completion of the dropwise addition, the reactant solution thus obtained was heated to 90° C. while being stirred, and the reactant solution was reacted by being further stirred for 2 hours while being maintained at 90° C. As a result of the reaction, a resin solution containing a carboxyl group in its molecule was obtained. A resin solution thus obtained had a solid content concentration of 50%, a weight-average molecular weight of 48,000, and an acid number of 78 mg KOH/g based on a solid content. Measurements of the solid content concentration and the weight-average molecular weight were carried out by the same methods as in Synthesis Example 1 above, and measurement of the acid number was carried out by the same method as in Synthesis Example 2.

Synthesis Example 4

<(A) Binder Polymer 4>

Into a reaction vessel equipped with a stirrer, a thermometer, and a nitrogen-inlet tube, 130.60 g of methyl triglyme (1,2-bis(2-methoxyethoxy)ethane) was poured as a solvent for polymerization. Then, 31.02 g (0.100 mol) of 3,3',4,4'-oxydiphthalic acid dianhydride, 12.92 g (0.030 mol) of bis[4-(3-aminophenoxy)phenyl]sulfone, and 86.66 g (0.070 mol) of poly(tetramethylene/3-methyltetramethylene ether) glycol bis(4-aminobenzoate) were added thereto, and a mixture was stirred for 30 minutes under nitrogen stream, so that a polyamide acid solution was obtained. Then, the solution was heated to 190° C. for 2 hours for reaction. As a result of the reaction, a resin solution containing an imide group in its molecule was obtained. The resin solution thus obtained had a solid content concentration of 49% and a weight-average molecular weight of 28,000. Measurements of the solid content concentration and the weight-average molecular weight were carried out by the same method as in Synthesis Example 1 above.

Synthesis Example 5

<(B-1) Black-Pigment-Containing Cross-Linked Polymer Particles>

Into a 1L separable flask equipped with a stirrer, a thermometer, a dropping funnel, a condenser tube, and a nitrogen-inlet tube, 400.00 g of ion-exchange water was poured and was then heated to 60° C. while being stirred under nitrogen stream. To the ion-exchange water thus heated, a mixed solution prepared by mixing, in advance at room temperature, (i) 94.00 g of polytetramethyleneglycol (manufactured by Mitsubishi Chemical Corporation, trade name: PTMG2000, a weight-average molecular weight of 2000), (ii) 56.00 g of hexamethylene diisocyanate-based isocyanurate type polyisocyanate (manufactured by Asahi Kasei Chemicals Corporatio; trade name Duranate™ TPA-100; NCO content: 23.1 wt %), (iii) 20.00 g of carbon black (manufactured by Mitsubishi Chemical Corporation, trade name: #2600) as a black pigment, (iv) 50.00 g of methyl ethyl ketone as a solvent, and (iv) 0.0015 g of dibutyltin dilaurate as a polymerization catalyst, was added dropwise over 2 hours while being heated at 60° C. After completion of the dropwise addition, the reactant solution thus obtained was reacted while being stirred at 60° C. over 4 hours. Subsequently, the reactant solution was cooled down to room temperature, and a solid was separated from the reactant solution. Thereafter, the solid was washed three times with ion-exchange water and then dried at 70° C. for 20 hours to obtain cross-linked polymer particles. The cross-linked polymer particles thus obtained were 7 μm in average particle diameter, and the amount of oil absorption of the cross-linked polymer particles was 120 ml/100 g. Note that measurements of the average particle diameter and the amount of oil absorption were carried out by methods as below.

<Average Particle Diameter Measurement>

Apparatus used: LA-950 V2 manufactured by Horiba, Ltd.

Measurement method: laser differential/scattering method.

<Amount of Oil Absorption>

Measurement of the amount of oil absorption was carried out in accordance with JIS K 5101-13-2.

Synthesis Example 6

<(B-2) White-Pigment-Containing Cross-Linked Polymer Particles>

Into a 1L separable flask equipped with a stirrer, a thermometer, a dropping funnel, and a nitrogen-inlet tube, 400.00 g of ion-exchange water was poured and was then heated to 60° C. while being stirred under nitrogen stream. To the ion-exchange water thus heated, a mixed solution prepared by mixing, in advance at room temperature, (i) 94.00 g of polytetra-methyleneglycol (manufactured by Mitsubishi Chemical Corporation, trade name: PTMG2000, a weight-average molecular weight of 2000), (ii) 56.00 g of hexamethylene diisocyanate-based isocyanurate type polyisocyanate (manufactured by Asahi Kasei Chemicals Corporatio; trade name Duranate™ TPA-100; NCO content: 23.1 wt %), (iii) 60.00 g of rutile type titanium dioxide (manufactured by ISHIHARA SANGYO KAISHA, LTD., trade name: TIPAQUE CR-60) as a white pigment, (iv) 50.00 g of methyl ethyl ketone as a solvent, and (iv) 0.0015 g of dibutyltin dilaurate as a polymerization catalyst, was added dropwise over 2 hours while being heated at 60° C. After completion of the dropwise addition, the reactant solution thus obtained was reacted while being stirred at 60° C. over 4 hours. Subsequently, the reactant solution was cooled down to room temperature, and a solid was separated from the reactant solution. Thereafter, the solid was washed three times with ion-exchange water and then dried at 70° C. for 20 hours to obtain cross-linked polymer particles. The cross-linked polymer particles thus obtained were 7 μm in average particle diameter, and the amount of oil absorption of the cross-linked polymer particles was 100 ml/100 g. Note that measurements of the average particle diameter and the amount of oil absorption were carried out by similar methods to those of Synthesis Example 5.

Examples 1 to 6

<Preparation of Resin Composition for Black Insulating Film>

To each of the (A) binder polymers obtained in Synthesis Examples 1 to 4, were added (B-1) black-pigment-containing cross-linked polymer particles obtained as the component (B) in Synthesis Example 5, a (C) thermosetting resin, a (F) phosphoric flame retardant, other components, and an organic solvent to prepare resin compositions for black insulating films. Respective amounts of constituent raw materials in terms of a resin solid content and the types of the constituent raw materials are shown in Table 1. In Table 1, an amount of 1,2-bis(2-methoxyethoxy)ethane, which is a solvent, indicates a total amount of solvent including a solvent contained in a corresponding one of the resin solutions synthesized above. The resin compositions for black insulating films were each prepared by first mixing components by use of a general stirring device having a stirring blade and then passing a resultant mixture through a triple-roll mill twice to obtain a uniform solution. All of the resin compositions for black insulating films had a particle diameter of not more than 10 μm as measured by use of a grindmeter. The mixed solution was completely defoamed in a defoaming device, and then subjected to the following evaluations.

strips for 3 seconds. Thereafter, the load was removed, and the overlaid strips were then peeled off each other. The coating film sides of the strips thus peeled off were observed.

"G (Good)" indicates that the coating films were separated from each other with no tacks left on the coating films;

"U (Unsatisfactory)" indicates that the coating films were slightly stuck to each other with a tack left on the coating films; and "P (Poor)" indicates that the coating films were completely stuck to each other to such a degree that the coating films could not be peeled off each other.

(ii) Folding Endurance

By a method that is the same as the method described in <Formation of Coating Film on Polyimide Film> above, a

TABLE 1

| Component | | Ex. 1 | Ex. 2 | Ex. 3 | Ex. 4 | Ex. 5 | Ex. 6 |
|---|---|---|---|---|---|---|---|
| | | | | | | Unit: Part by Weight | |
| (A) | Synthesis Example 1 | 60.0 | — | — | — | 60.0 | 60.0 |
| | Synthesis Example 2 | — | 60.0 | — | — | — | — |
| | Synthesis Example 3 | — | — | 60.0 | — | — | — |
| | Synthesis Example 4 | — | — | — | 60.0 | — | — |
| (B) | Synthesis Example 5 (B-1) | 30.0 | 30.0 | 30.0 | 30.0 | — | 30.0 |
| | G-800BK <1> | — | — | — | — | 30.0 | — |
| (C) | TEPIC-SP <2> | 10.0 | 10.0 | 10.0 | 10.0 | 10.0 | 10.0 |
| (F) | Exolit OP-935 <3> | — | — | — | — | — | 20.0 |
| Others | Fine Powder Melamine <4> | 1.0 | 1.0 | 1.0 | 1.0 | 1.0 | 1.0 |
| | FLOWLEN AC-2000 <4> | 1.0 | 1.0 | 1.0 | 1.0 | 1.0 | 1.0 |
| Solvent | 1,2-bis(2-methoxyethoxy)ethane | 100.0 | 100.0 | 100.0 | 100.0 | 100.0 | 100.0 |

Note that <1> to <5> in Table 1 are as follows.
<1> A product name of black-pigment-containing cross-linked acrylic particles (average particle diameter: 6 μm) manufactured by Negami Chemical Industrial Co., Ltd.
<2> A product name of a multi-functional epoxy resin (triglycidyl isocyanurate) manufactured by Nissan Chemical Industries, Ltd.
<3> A product name of phosphinate manufactured by Clariant (Japan) K. K.
<4> A product name of melamine manufactured by Nissan Chemical Industries, Ltd.
<5> A product name of a butadiene defoaming agent manufactured by Kyoeisha Chemical Co., Ltd.

<Formation of Coating Film on Polyimide Film>

With the use of a Baker's applicator, the resin compositions for black insulating films were each flow-cast and applied to a 100 mm×100 mm area of a 25-μm polyimide film (manufactured by Kaneka Corporation, product name: 25NPI) so that a finally dried film had a thickness of 20 μm. A resultant film was dried at 80° C. for 20 minutes and then cured by heating in an oven at 150° C. for 30 minutes. In this manner, a black insulating film was formed on the polyimide film.

<Evaluation of Black Insulating Film>

The black insulating film thus prepared was evaluated in terms of the following items. Evaluation results are shown in Table 2.

(i) Tack Property

With the use of a Baker's applicator, each of the resin compositions for black insulating films were each flow-cast and applied to a 100 mm×100 mm area of a 25-μm polyimide film (manufactured by Kaneka Corporation, product name: 25NPI) so that a finally dried film had a thickness of 20 μm. A resultant film was dried at 80° C. for 20 minutes to prepare a coating film from which the solvent had been dried off. As a result, a film equipped with the coating film was produced. The evaluation of tack property on the coating film was carried out in the following method. The thus prepared film equipped with the dried coating film was cut out into strips each having a size of 50 mm×30 mm. The strips of the coating film were overlaid with each other in such a state that coating film sides of the strips face inside. Subsequently, a load of 300 g was placed on the overlaid 20-μm thick black insulating-film-laminated film was prepared on a surface of a 25-μm thick polyimide film (manufactured by Kaneka Corporation, product name: APICAL 25NPI). The evaluation of folding endurance on the black insulating-film-laminated film was carried out in the following method. The black insulating-film-laminated film was cut out into strips each having a size of 50 mm×10 mm. Each of the strips was folded at a point 25 mm from its edge to an angle of 180° in such a state that the black insulating film faces outside. Then, a load of 5 kg was placed on a folded part of the strip for 3 seconds. After that, the load was removed, and an apex of the folded part was observed microscopically. After the microscopic observation, the strip was unfolded, and a load of 5 kg was then placed on the unfolded strip for 3 seconds. After that, the load was removed, and the strip of the cured-film-laminated film was completely unfolded. The above action was repeatedly carried out. The evaluation of folding endurance on the insulating-film-laminated film was carried out in how many times folding had been carried out before cracking occurred on the folded part. Folding endurance is desirably such that no cracking occurs on the insulating film at the completion of fifth or more round of folding.

(iii) Electrical Insulation Reliability

On a flexible copper-clad laminate (the thickness of an electrolytic copper foil is 12 μm, a polyimide film is Apical 25 NPI manufactured by Kaneka Corporation, and the copper foil is bonded by a polyimide adhesive agent), a comb-shaped pattern (line width/space width=100 μm/100 μm) was formed. The flexible copper-clad laminate was then immersed in a 10 volume % sulfuric acid aqueous solution for 1 minute, washed with purified water, and subjected to a surface treatment of the copper foil. After that, by a method that is the same as the method described in <Formation of Coating Film on Polyimide Film> above, a 20-μm thick black insulating film was formed on the comb-shaped pattern, so as to prepare a test piece. The test piece was set in an environmental test apparatus at 85° C. and 85% RH, a direct current at 100 V was applied to both ends of the test piece, and measurement of an insulation resistance value of the test piece was carried out 1000 hours after the start of the test. The resistance value of the insulating film is preferably not less than $1 \times 10^8$. Further, 1000 hours after the start of the test, visual observations were made on the occurrence of any change in appearance such as migration or formation of dendrites.

"G (Good)" indicates that 1000 hours after the start of the test, no occurrence of any change in appearance such as migration or formation of dendrites was observed;

"U (Unsatisfactory)" indicates that 1000 hours after the start of the test, the occurrence of a slight change in appearance such as migration or formation of dendrites was observed; and "P (Poor)" indicates that 1000 hours after the start of the test, the occurrence of a notable change in appearance such as migration or formation of dendrites was observed.

(iv) Solder Heat Resistance

By a method that is the same as the method described in <Formation of Coating Film on Polyimide Film> above, a 20-μm thick black insulating-film-laminated film was prepared on a surface of a 75-μm thick polyimide film (manufactured by Kaneka Corporation, product name: APICAL 75NPI). A resultant black insulating-film-laminated film was floated on a solder bath that was completely melted at 260° C., in such a state that a surface on which the black insulating film was applied was in contact with the solder bath. Ten seconds later, the black insulating-film-laminated film was pulled up. This operation was repeated 3 times, and the state of the surface of the film was observed.

"G (Good)" indicates that there was nothing wrong with the coating film; and

"P (Poor)" indicates that swelling, detachment, and/or the like problem occurred on the coating film.

(v) Warpage

By a method that is the same as the method described in <Formation of Coating Film on Polyimide Film> above, a 20-μm thick black insulating-film-laminated film was prepared on a surface of a 25-μm thick polyimide film (manufactured by Kaneka Corporation, product name: APICAL 25NPI). The black insulating-film-laminated film thus obtained was cut out into an area of 50 mm×50 mm, and the film was placed on a flat and smooth table so that the black insulating film side thereof faced upward. Then, a degree of warpage of the film at its end portion was measured. FIG. 1 is a schematic view of the measured portion. As the amount of warpage on the surface of the polyimide film is small, stress exerted on a surface on a printed wiring board becomes small. This decreases in amount of warpage of the printed wiring board accordingly. It is preferable that the amount of warpage be not more than 5 mm. Note that in a case the black insulating-film-laminated film was rated as "P (poor)" when it curled into a tubular form.

(vi) Hiding Property

By a method that is the same as the method described in <Formation of Coating Film on Polyimide Film> above, a 20-μm thick black insulating-film-laminated film was prepared on a surface of a 25-μm thick polyimide film (APICAL 25NPI manufactured by Kaneka Corporation). The black insulating-film-laminated film thus obtained was placed on a sheet of section paper with 1 mm×1 mm squares, and the squares were visually observed from above the test piece.

"G (Good)" indicates that the squares were not visible; and
"P (Poor)" indicates that the squares were visible.

TABLE 2

| Evaluation Item | Ex. 1 | Ex. 2 | Ex. 3 | Ex. 4 | Ex. 5 | Ex. 6 | Com. Ex. 1 | Com. Ex. 2 | Com. Ex. 3 |
|---|---|---|---|---|---|---|---|---|---|
| Tack Property | G | G | G | G | G | G | G | P | P |
| Folding Endurance (time) | 20 | 15 | 10 | 10 | 10 | 10 | 1 | 3 | 0 |
| Electrical Insulation Reliability | | | | | | | | | |
| Insulation Resistance Value (Ω) | $2 \times 10^8$ | $5 \times 10^8$ | $1 \times 10^8$ | $1 \times 10^9$ | $3 \times 10^8$ | $2 \times 10^8$ | $1 \times 10^5$ | $5 \times 10^9$ | $8 \times 10^6$ |
| Appearance Change | G | G | G | G | G | G | P | G | P |
| Solder Heat Resistance | G | G | G | G | G | G | G | G | G |
| Warpage (mm) | 2.0 | 2.5 | 2.0 | 2.5 | 3.0 | 2.0 | 6.0 | 5.0 | 15.0 |
| Hiding Property | G | G | G | G | G | G | G | P | G |

Comparative Example 1

Physical property evaluations were carried out by a method that is the same as the method described in Example 1 by use of poly(methyl-methacrylate) cross-linked polymer particles (manufactured by Ganz Chemical Co., Ltd., trade name GanzPearl GM-0801S, average particle diameter of 8 μm) to which 4 parts by weight of carbon black (manufactured by Mitsubishi Chemical Corporation, trade name: #2600) was added as the black pigment, instead of (B-1) the black-pigment-containing cross-linked polymer particles which were prepared in Synthesis Example 5 and used in Example 1. Evaluation results are shown in Table 2.

Comparative Example 2

Physical property evaluations were carried out by a method that is the same as the method described in Example 1 by use of the following components: 60 parts by weight of resin having a urethane bond and a carboxyl group in its molecule, as the binder polymer prepared in Synthesis Example 2; 22.5 parts by weight of epoxy resin (manufactured by Japan Epoxy Resins Co., Ltd., product name: jER828); 2.5 parts by weight of melamine (manufactured by Nissan Chemical Industries, Ltd., product name: Fine Powder Melamine); and 12.0 parts by weight of organic fine particles having a core-shell multilayer structure (manufactured by Ganz Chemical Co., Ltd., product name: STAPHYLOID AC-3816, average particle diameter of 0.5 µm). Evaluation results are shown in Table 2.

Comparative Example 3

Physical property evaluations were carried out by a method that is the same as the method described in Example 1 by use of 4 parts by weight of carbon black (manufactured by Mitsubishi Chemical Corporation, trade name: #2600) as the black pigment instead of (B-1) the black-pigment-containing cross-linked polymer particles which were prepared in Synthesis Example 5 and used in Example 1. Evaluation results are shown in Table 2.

Examples 7 to 13

<Preparation of Resin Composition for Black Insulating Film>

To each of the (A) binder polymers obtained in Synthesis Examples 1 to 4, were added (B-1) black-pigment-containing cross-linked polymer particles obtained in Synthesis Example 5 as the component (B), a (C) thermosetting resin, a (D) compound having a radically polymerizable group in its molecule, a (E) photo-polymerization initiator, a (F) phosphoric flame retardant, other components, and an organic solvent to prepare resin compositions for black insulating films. Respective amounts of constituent raw materials in terms of a resin solid content and the types of the constituent raw materials are shown in Table 3. In Table 3, an amount of 1,2-bis(2-methoxyethoxy)ethane, which is a solvent, indicates a total amount of solvent including a solvent contained in a corresponding one of the resin solutions synthesized above. The resin compositions for black insulating films were each prepared by first mixing components by use of a general stirring device having a stirring blade and then passing a resultant mixture through a triple-roll mill twice to obtain a uniform solution. All of the resin compositions for black insulating films had a particle diameter of not more than 10 µm as measured by use of a grindmeter. The mixed solution was completely defoamed in a defoaming device, and then subjected to the following evaluations.

TABLE 3

| | | Unit: Part by Weight | | | | | | |
|---|---|---|---|---|---|---|---|---|
| Component | | Ex. 7 | Ex. 8 | Ex. 9 | Ex. 10 | Ex. 11 | Ex. 12 | Ex. 13 |
| (A) | Synthesis Example 1 | 40.0 | — | — | — | — | — | — |
| | Synthesis Example 2 | — | 40.0 | — | — | 40.0 | 40.0 | 40.0 |
| | Synthesis Example 3 | — | — | 40.0 | — | — | — | — |
| | Synthesis Example 4 | — | — | — | 4.00 | — | — | — |
| (B) | Synthesis Example 5 (B-1) | 30.0 | 30.0 | 30.0 | 30.0 | — | 12.0 | 40.0 |
| | G-800BK <1> | — | — | — | — | 30.0 | — | — |
| (C) | TEPIC-SP <2> | 10.0 | 10.0 | 10.0 | 10.0 | 10.0 | 10.0 | 10.0 |
| (D) | FANCRYL FA-321M <6> | 15.0 | 15.0 | 15.0 | 15.0 | 15.0 | 15.0 | 15.0 |
| | UXE-3000 <7> | 20.0 | 20.0 | 20.0 | 20.0 | 20.0 | 20.0 | 20.0 |
| (E) | IRUGACURE 369 <8> | 3.0 | 3.0 | 3.0 | 3.0 | 3.0 | 3.0 | 3.0 |
| (F) | Exolit OP-935 <3> | 20.0 | 20.0 | 20.0 | 20.0 | 20.0 | 20.0 | 20.0 |
| Others | Fine Powder Melamine <4> | 1.0 | 1.0 | 1.0 | 1.0 | 1.0 | 1.0 | 1.0 |
| | FLOWLEN AC-2000 <5> | 1.0 | 1.0 | 1.0 | 1.0 | 1.0 | 1.0 | 1.0 |
| Solvent | 1,2-bis(2-methoxyethoxy)ethane | 100.0 | 100.0 | 100.0 | 100.0 | 100.0 | 100.0 | 100.0 |

Note that <1> to <8> in Table 1 are as follows.
<1> A product name of black-pigment-containing cross-linked acrylic particles (average particle diameter: 6 µm) manufactured by Negami Chemical Industrial Co., Ltd.
<2> A product name of a multi-functional epoxy resin (triglycidyl isocyanurate) manufactured by Nissan Chemical Industries, Ltd.
<3> A product name of phosphinate manufactured by Clariant (Japan) K. K.
<4> A product name of melamine manufactured by Nissan Chemical Industries, Ltd.
<5> A product name of a butadiene defoaming agent manufactured by Kyoeisha Chemical Co., Ltd.
<6> A product name of a compound having a radically polymerizable group in its molecule (EO-modified bisphenol A dimethacrylate) manufactured by Hitachi Chemical Co., Ltd.
<7> A product name of a compound having a radically polymerizable group in its molecule (resin containing a carboxyl group and a photosensitive group) (solid content concentration of 65%, acid number of 98 mgKOH/g based on solid content) manufactured by Nippon Kayaku Co., Ltd
<8> A product name of a photo-polymerization initiator manufactured by BASF Japan Ltd.

<Formation of Coating Film on Polyimide Film>

With the use of a Baker's applicator, the resin compositions for black insulating films were each flow-cast and applied to a 100 mm×100 mm area of a 25-µm thick polyimide film (manufactured by Kaneka Corporation, product name: 25NPI) so that a finally dried film had a thickness of 20 µm. A resultant film was dried at 80° C. for 20 minutes and then exposed to ultraviolet rays having an integrated exposure amount of 300 mJ/cm$^2$. Subsequently, the film was developed by spraying a 1.0 weight % sodium carbonate aqueous solution heated to 30° C., at a spraying pressure of 1.0 kgf/mm$^2$ for 90 seconds. After the development, the film was rinsed with purified water sufficiently, and then cured by heating in an oven at 150° C. for 30 minutes. In this manner, cured film made from the resin composition for a black insulating film was formed on the polyimide film.

<Evaluation of Cured Film>

The cured film thus prepared was evaluated in regard to the following items. Evaluation results are shown in Table 4.

(vii) Photosensitivity

Photosensitivity was evaluated by observing a surface of a cured film prepared by a method that is the same as the method described in <Formation of Coating Film on Polyimide Film> above. Note that exposure was carried out by placing a negative photomask having a line width/space width=100 µm/100 µm.

"G (Good)" indicates that a sensitive pattern of line width/space width=100 µm/100 µm was clearly formed on a surface of a polyimide film, and the sensitive pattern has no notable bold line and no residue from development; and "P (Poor)" indicates that a sensitive pattern of line width/space width=100/100 µm was not formed on a surface of a polyimide film.

(viii) Tack Property

With the use of a Baker's applicator, the resin compositions for black insulating films were each flow-cast and applied to a 100 mm×100 mm area of a 25-µm thick polyimide film (manufactured by Kaneka Corporation, product name: 25NPI) so that a finally dried film had a thickness of 20 µm. A resultant film was dried at 80° C. for minutes to prepare a coating film from which the solvent had been dried off. The evaluation of tack-free property on the coating film was carried out in the following method. The thus prepared film equipped with the dried coating film was cut out into strips each having a size of 50 mm×30 mm. The strips of the coating film were overlaid with each other in such a state that coating film sides of the strips face inside. Subsequently, a load of 300 g was placed on the overlaid strips for 3 seconds. Thereafter, the load was removed, and the overlaid strips were then peeled off each other. The coating film sides of the strips thus peeled off were observed.

"G (Good)" indicates that the coating films were separated from each other with no tacks left on the coating films;

"U (Unsatisfactory)" indicates that the coating films were slightly stuck to each other with a tack left on the coating films; and "P (Poor)" indicates that the coating films were completely stuck to each other to such a degree that the coating films could not be peeled off each other.

(ix) Folding Endurance

By a method that is the same as the method described in <Formation of Cured Film on Polyimide Film> above, a 20-µm cured-film-laminated film made from a resin composition for a black insulating film was prepared on a surface of a 25-µm thick polyimide film (manufactured by Kaneka Corporation, product name: APICAL 25NPI). The evaluation of folding endurance on the cured-film-laminated film was carried out in the following method. The cured-film-laminated film was cut out into strips each having a size of 50 mm×10 mm. Each of the strips was folded at a point 25 mm from its edge to an angle of 180° in such a state that the cured film faces outside. Then, a load of 5 kg was placed on a folded part of the strip for 3 seconds. After that, the load was removed, and an apex of the folded part was observed microscopically. After the microscopic observation, the strip was unfolded, and a load of 5 kg was then placed on the unfolded strip for 3 seconds. After that, the load was removed, and the strip of the cured-film-laminated film was completely unfolded. The above action was repeatedly carried out. The evaluation of folding endurance on the insulating-film-laminated film was carried out in how many times folding had been carried out before cracking occurred on the folded part. Folding endurance is desirably such that no cracking occurs on the insulating film at the completion of fifth or more round of folding.

(x) Electrical Insulation Reliability

On a flexible copper-clad laminate (the thickness of an electrolytic copper foil is 12 µm, a polyimide film is Apical 25 NPI manufactured by Kaneka Corporation, and the copper foil is bonded by a polyimide adhesive agent), a comb-shaped pattern (line width/space width=100 µm/100 µm) was formed. The flexible copper-clad laminate was then immersed in a 10 volume % sulfuric acid aqueous solution for 1 minute, washed with purified water, and subjected to a surface treatment of the copper foil. After that, by a method that is the same as the method described in <Formation of Coating Film on Polyimide Film>, a 20-µm thick cured film made from a resin composition for a black insulating film was formed on the comb-shaped pattern, so as to prepare a test piece. The test piece was set in an environmental test apparatus at 85° C. and 85% RH, a direct current at 100 V was applied to both ends of the test piece, and measurement of an insulation resistance value of the test piece was carried out 1000 hours after the start of the test. The resistance value is preferably not less than $1\times10^8$. Further, 1000 hours after the start of the test, visual observations were made on the occurrence of any change in appearance such as migration or formation of dendrites.

"G (Good)" indicates that 1000 hours after the start of the test, no occurrence of any change in appearance such as migration or formation of dendrites was observed;

"U (Unsatisfactory)" indicates that 1000 hours after the start of the test, the occurrence of a slight change in appearance such as migration or formation of dendrites was observed; and "P (Poor)" indicates that 1000 hours after the start of the test, the occurrence of a notable change in appearance such as migration or formation of dendrites was observed.

(xi) Solder Heat Resistance

By a method that is the same as the method described in <Formation of Coating Film on Polyimide Film> above, a 20-µm cured-film-laminated film made from a resin composition for a black insulating film was prepared on a surface of a 75-µm thick polyimide film (manufactured by Kaneka Corporation, product name: APICAL 75NPI). A resultant cured-film-laminated film was floated on a solder bath that was completely melted at 260° C., in such a state that one surface of the cured-film-laminated film, on which the cured film made from the resin composition for a black insulating film was applied, was in contact with the solder bath. Ten seconds later, the insulating-film-laminated film was pulled up. This operation was repeated 3 times, and the state of the surface of the film was observed.

"G (Good)" indicates that there was nothing wrong with the coating film; and

"P (Poor)" indicates that swelling, detachment, and/or the like problem occurred on the coating film.

(xii) Warpage

By a method that is the same as the method described in <Formation of Coating Film on Polyimide Film> above, a 20-µm thick black cured-film-laminated film was prepared on a surface of a 25-µm thick polyimide film (manufactured by Kaneka Corporation, product name: APICAL 25NPI). The cured-film-laminated film thus obtained was cut out into an area of 50 mm×50 mm, and the film was placed on a flat and smooth table so that the coating film faced upward. Then, a degree of warpage of the film at its end portion was measured. FIG. 1 is a schematic view of the measured portion. As the amount of warpage on the surface of the polyimide film is small, stress exerted on a surface on a printed wiring board becomes small. This decreases in amount of warpage of the printed wiring board accordingly. It is preferable that the amount of warpage be not more than 5 mm. Note that in a case the cured-film-laminated film was rated as "P (poor)" when it curled into a tubular form.

(xiii) Hiding Property

By a method that is the same as the method described in <Formation of Coating Film on Polyimide Film> above, a 20-μm thick black insulating-film-laminated film was prepared on a surface of a 25-μm thick polyimide film (manufactured by Kaneka Corporation, product name: APICAL 25NPI). The black insulating-film-laminated film thus obtained was placed on a sheet of section paper with mm×1 mm squares, and the squares were visually observed from above the test piece.

"G (Good)" indicates that the squares were not visible; and "P (Poor)" indicates that the squares were visible.

(xiv) Flame Retardancy

In accordance with UL94VTM standard for test for flammability of plastic materials, a flammability test was carried out as follows. By a method that is the same as the method described in <Formation of Coating Film on Polyimide Film> above, a 20-μm cured-film-laminated film made from the resin composition for a black insulating film was prepared on both surfaces of a 25-μm thick polyimide film (product name: APICAL 25NPI manufacture by Kaneka Corporation). The sample thus prepared was cut into specimens each having a dimension of 50 mm in width, by 200 mm in length, and by 75 μm in thickness (including the thickness of the polyimide film). The specimens were each marked with a line across the specimen width at a 125 mm position, and each of the specimens was then rolled into a tubular form of approximately 13 mm in diameter. Thereafter, a PI (polyimide) tape is placed, without clearance, over (a) an overlapping portion (75 mm-long portion) of the specimen above the marked line and (b) an upper end portion of the specimen above the overlapping portion. In this manner, 20 tubes for use in the flammability test were prepared. Out of the 20 tubes, tubes were processed (1) at 23° C. and a relative humidity of 50% for 48 hours, whereas the remaining 10 tubes were processed (2) at 70° C. for 168 hours and then cooled for more than 4 hours in a desiccator containing anhydrous calcium chloride. These samples were each clamped at the upper end portion thereof so as to be fixed upright, and flame of a burner was applied to a free lower end portion of the sample for 3 seconds so that the free lower end portion was ignited. After a lapse of 3 seconds, the flame of the burner was removed from the sample, and the length of time (in seconds) for which the sample continued to flame and/or burn after the burner had been removed from the sample was measured.

"G (Good)" indicates that the 10 samples each out of two sets of the samples processed respectively under the conditions (1) and (2), ceased to flame and/or burn and automatically became extinct within 10 seconds on average and within 10 seconds at maximum after the removal of the burner from the sample, and ceased to burn before flaming reaches the marked line.

"P (Poor)" indicates that even one sample did not extinct within 10 seconds after the removal of the burner or burned with flame going up to or beyond the marked line.

TABLE 4

| Evaluation Item | Ex. 7 | Ex. 8 | Ex. 9 | Ex. 10 | Ex. 11 | Ex. 12 | Ex. 13 | Com. Ex. 4 | Com. Ex. 5 |
|---|---|---|---|---|---|---|---|---|---|
| Photosensitivity | G | G | G | G | G | G | G | G | G |
| Tack Property | G | G | G | G | G | G | G | G | P |
| Folding Endurance (time) | 8 | 7 | 5 | 5 | 5 | 5 | 8 | 2 | 0 |
| Electrical Insulation Reliability | | | | | | | | | |
| Insulation Resistance Value (Ω) | $4 \times 10^8$ | $7 \times 10^8$ | $1 \times 10^8$ | $2 \times 10^9$ | $3 \times 10^8$ | $6 \times 10^8$ | $1 \times 10^8$ | $4 \times 10^5$ | $7 \times 10^5$ |
| Appearance Change | G | G | G | G | G | G | G | P | P |
| Solder Heat Resistance | G | G | G | G | G | G | G | G | G |
| Warpage (mm) | 1.5 | 2.0 | 1.5 | 2.5 | 3.0 | 2.0 | 1.0 | 8.0 | 20.0 |
| Hiding Property | G | G | G | G | G | G | G | G | G |
| Flame Retardancy | G | G | G | G | G | G | G | G | G |

Comparative Example 4

Physical property evaluations were carried out by a method that is the same as the method described in Example 7 by use of poly(methylmethacrylate) cross-linked polymer particles (manufactured by Ganz Chemical Co., Ltd., trade name GanzPearl GM-0801S, average particle diameter of 8 μm) to which 4 parts by weight of carbon black (manufactured by Mitsubishi Chemical Corporation, trade name: #2600) was added as the black pigment, instead of (B-1) the black-pigment-containing cross-linked polymer particles which were prepared in Synthesis Example 5 and used in Example 7. Evaluation results are shown in Table 4.

Comparative Example 5

Physical property evaluations were carried out by a method that is the same as the method described in Example 7 by use of 4 parts by weight of carbon black (manufactured by Mitsubishi Chemical Corporation, trade name: #2600) added as the black pigment instead of (B-1) the black-pigment-containing cross-linked polymer particles which were prepared in Synthesis Example 5 and used in Example 7. Evaluation results are shown in Table 4.

Examples 14 to 19

<Preparation of Resin Composition for White Insulating Film>

To each of the (A) binder polymers obtained in Synthesis Examples 1 to 4, were added (B-2) white-pigment-containing cross-linked polymer particles obtained in Synthesis Example 6 as the component (B), a (C) thermosetting resin, a (F) phosphoric flame retardant, other components, and an organic solvent to prepare resin compositions for white insulating films. Respective amounts of constituent raw materials in terms of a resin solid content and the types of the constituent raw materials are shown in Table 5. In Table 5, an amount of 1,2-bis(2-methoxyethoxy)ethane, which is a solvent, indicates a total amount of solvent including a solvent contained in a corresponding one of the resin solutions synthesized above. The resin compositions for white insulating films were each prepared by first mixing components by use of a general stirring device having a stirring blade and then passing a resultant mixture through a triple-roll mill twice to obtain a uniform solution. All of the resin compositions for white insulating films had a particle diameter of not more than 10 μm as measured by use of a grindmeter. The mixed solution was completely defoamed in a defoaming device, and then subjected to the following evaluations.

TABLE 5

| Component | | Unit: Part by Weight | | | | | |
|---|---|---|---|---|---|---|---|
| | | Ex. 14 | Ex. 15 | Ex. 16 | Ex. 17 | Ex. 18 | Ex. 19 |
| (A) | Synthesis Example 1 | 60.0 | — | — | — | 60.0 | 60.0 |
| | Synthesis Example 2 | — | 60.0 | — | — | — | — |
| | Synthesis Example 3 | — | — | 60.0 | — | — | — |
| | Synthesis Example 4 | — | — | — | 60.0 | — | — |
| (B) | Synthesis Example 6 (B-2) | 50.0 | 50.0 | 50.0 | 50.0 | — | 50.0 |
| | G-800WA <1> | — | — | — | — | 50.0 | — |
| (C) | TEPIC-SP <2> | 10.0 | 10.0 | 10.0 | 10.0 | 10.0 | 10.0 |
| (F) | Exolit OP-935 <3> | — | — | — | — | — | 20.0 |

TABLE 5-continued

| Component | | Unit: Part by Weight | | | | | |
|---|---|---|---|---|---|---|---|
| | | Ex. 14 | Ex. 15 | Ex. 16 | Ex. 17 | Ex. 18 | Ex. 19 |
| Others | Fine Powder Melamine <4> | 1.0 | 1.0 | 1.0 | 1.0 | 1.0 | 1.0 |
| | FLOWLEN AC-2000 <5> | 1.0 | 1.0 | 1.0 | 1.0 | 1.0 | 1.0 |
| Solvent | 1,2-bis(2-methoxyethoxy)-ethane | 100.0 | 100.0 | 100.0 | 100.0 | 100.0 | 100.0 |

Note that <1> to <7> in Table 1 are as follows.
<1> A product name of white-pigment-containing cross-linked acrylic particles (average particle diameter: 6 μm) manufactured by Negami Chemical Industrial Co., Ltd.
<2> A product name of a multi-functional epoxy resin (triglycidyl isocyanurate) manufactured by Nissan Chemical Industries, Ltd.
<3> A product name of phosphinate manufactured by Clariant (Japan) K. K.
<4> A product name of melamine manufactured by Nissan Chemical Industries, Ltd.
<5> A product name of a butadiene defoaming agent manufactured by Kyoeisha Chemical Co., Ltd.

<Formation of Coating Film on Polyimide Film>

With the use of a Baker's applicator, the resin compositions for white insulating films were each flow-cast and applied to a 100 mm×100 mm area of a 25-μm thick polyimide film (manufactured by Kaneka Corporation, product name: 25NPI) so that a finally dried film had a thickness of 20 μm. A resultant film was dried at 80° C. for 20 minutes and then cured by heating in an oven at 150° C. for 30 minutes. In this manner, a white insulating film was formed on the polyimide film.

<Evaluation of White Insulating Film>

The white insulating film thus prepared was evaluated in regard to the following items. Evaluation results are shown in Table 6. Note that a tack property, folding endurance, electrical insulation reliability, solder heat resistance, and warpage were evaluated by similar methods to those of Examples 1 to 6.

(I) Reflectance

By a method that is the same as the method described in <Formation of Coating Film on Polyimide Film> above, a 20-μm white-insulating-film-laminated film was prepared on a surface of a 25-μm thick polyimide film (APICAL 25NPI manufactured by Kaneka Corporation). By use of the white-insulating-film-laminated film thus obtained, reflectance of the white insulating film was measured by the following method, and a measured value at 450 nm was determined as the reflectance of the white insulating film. It is preferable that the reflectance be not less than 80%.

Apparatus used: visible spectrophotometer V-650 manufactured by JASCO Corporation Measured wavelength region: 300 nm to 800 nm Standard white plate: Spectraron™ manufactured by Labsphere, Inc.

TABLE 6

| Evaluation Item | Ex. 14 | Ex. 15 | Ex. 16 | Ex. 17 | Ex. 18 | Ex. 19 | Com. Ex. 6 | Com. Ex. 7 | Com. Ex. 8 |
|---|---|---|---|---|---|---|---|---|---|
| Tack Property | G | G | G | G | G | G | G | P | P |
| Folding Endurance (time) | 10 | 8 | 8 | 6 | 6 | 6 | 0 | 3 | 0 |
| Electrical Insulation Reliability | | | | | | | | | |
| Insulation Resistance Value (Ω) | $2 \times 10^9$ | $4 \times 10^9$ | $2 \times 10^8$ | $1 \times 10^{10}$ | $1 \times 10^9$ | $2 \times 10^9$ | $1 \times 10^9$ | $5 \times 10^9$ | $4 \times 10^9$ |
| Appearance Change | G | G | G | G | G | G | G | G | G |

TABLE 6-continued

| Evaluation Item | Ex. 14 | Ex. 15 | Ex. 16 | Ex. 17 | Ex. 18 | Ex. 19 | Com. Ex. 6 | Com. Ex. 7 | Com. Ex. 8 |
|---|---|---|---|---|---|---|---|---|---|
| Solder Heat Resistance | G | G | G | G | G | G | G | G | G |
| Warpage (mm) | 1.0 | 2.0 | 1.0 | 2.5 | 2.0 | 2.0 | 6.0 | 5.0 | 18.0 |
| Reflectance (%) | 80 | 80 | 80 | 80 | 80 | 81 | 80 | 5 | 80 |

Comparative Example 6

Physical property evaluations were carried out by a method that is the same as the method described in Example 14 by use of polymethacrylate methyl cross-linked polymer particles (manufactured by Ganz Chemical Co., Ltd., trade name GanzPearl GM-0801S, average particle diameter of 8 μm) to which 12.50 parts by weight of rutile type titanium dioxide (manufactured by ISHIHARA SANGYO KAISHA, LTD., trade name TIPAQUE CR-60) was added as the white pigment, instead of (B-2) the white-pigment-containing cross-linked polymer particles which were prepared in Synthesis Example 6 and used in Example 14. Evaluation results are shown in Table 6.

Comparative Example 7

Physical property evaluations were carried out by a method that is the same as the method described in Example 14 by use of the following components: 60 parts by weight of resin having a urethane bond and a carboxyl group in its molecule, as the binder polymer prepared in Synthesis Example 2; 22.5 parts by weight of epoxy resin (manufactured by Japan Epoxy Resins Co., Ltd., product name: jER828); 2.5 parts by weight of melamine (manufactured by Nissan Chemical Industries, Ltd., product name: Fine Powder Melamine); and 12.0 parts by weight of organic fine particles having a core-shell multilayer structure (manufactured by Ganz Chemical Co., Ltd., product name: STAPHYLOID AC-3816, average particle diameter of 0.5 μm). Evaluation results are shown in Table 6.

Comparative Example 6

Physical property evaluations were carried out by a method that is the same as the method described in Example 14 by use of 12.50 parts by weight of rutile type titanium dioxide (manufactured by ISHIHARA SANGYO KAISHA, LTD., trade name TIPAQUE CR-60) added as the white pigment instead of (B-2) the white-pigment-containing cross-linked polymer particles which were prepared in Synthesis Example 6 and used in Example 14. Evaluation results are shown in Table 6.

Examples 20 to 25

<Preparation of Resin Composition for White Insulating Film>

To each of the (A) binder polymers obtained in Synthesis Examples 1 to 4, were added (B-2) white-pigment-containing cross-linked polymer particles obtained in Synthesis Example 6 as the component (B), a (C) thermosetting resin, a (D) compound having a radically polymerizable group in its molecule, a (E) photo-polymerization initiator, a (F) phosphoric flame retardant, other components, and an organic solvent to prepare resin compositions for white insulating films. Respective amounts of constituent raw materials in terms of a resin solid content and the types of the constituent raw materials are shown in Table 7. In Table 7, an amount of 1,2-bis(2-methoxyethoxy)ethane, which is a solvent, indicates a total amount of solvent including a solvent contained in a corresponding one of the resin solutions synthesized above. The resin compositions for white insulating films were each prepared by first mixing components by use of a general stirring device having a stirring blade and then passing a resultant mixture through a triple-roll mill twice to obtain a uniform solution. All of the resin compositions for white insulating films had a particle diameter of not more than 10 μm as measured by use of a grindmeter. The mixed solution was completely defoamed in a defoaming device, and then subjected to the following evaluations.

TABLE 7

Unit: Part by Weight

| Component | | Ex. 20 | Ex. 21 | Ex. 22 | Ex. 23 | Ex. 24 | Ex. 25 |
|---|---|---|---|---|---|---|---|
| (A) | Synthesis Example 1 | 40.0 | — | — | — | — | — |
|  | Synthesis Example 2 | — | 40.0 | — | — | 40.0 | 40.0 |
|  | Synthesis Example 3 | — | — | 40.0 | — | — | — |
|  | Synthesis Example 4 | — | — | — | 40.0 | — | — |
| (B) | Synthesis Example 6 (B-2) | 40.0 | 40.0 | 40.0 | 40.0 | — | 12.0 |
|  | G-800WA <1> | — | — | — | — | 40.0 | — |
| (C) | TEPIC-SP <2> | 10.0 | 10.0 | 10.0 | 10.0 | 10.0 | 10.0 |
| (D) | FANCRYL FA-321M <6> | 15.0 | 15.0 | 15.0 | 15.0 | 15.0 | 15.0 |
|  | UXE-3000 <7> | 20.0 | 20.0 | 20.0 | 20.0 | 20.0 | 20.0 |

TABLE 7-continued

| Component | | Ex. 20 | Ex. 21 | Ex. 22 | Ex. 23 | Ex. 24 | Ex. 25 |
|---|---|---|---|---|---|---|---|
| | | | | | | Unit: Part by Weight | |
| (E) | IRUGACURE 369 <8> | 3.0 | 3.0 | 3.0 | 3.0 | 3.0 | 3.0 |
| (F) | Exolit OP-935 <3> | 20.0 | 20.0 | 20.0 | 20.0 | 20.0 | 20.0 |
| Others | Fine Powder Melamine <4> | 1.0 | 1.0 | 1.0 | 1.0 | 1.0 | 1.0 |
| | FLOWLEN AC-2000 <5> | 1.0 | 1.0 | 1.0 | 1.0 | 1.0 | 1.0 |
| Solvent | 1,2-bis(2-methoxyethoxy)ethane | 100.0 | 100.0 | 100.0 | 100.0 | 100.0 | 100.0 |

Note that <1> to <8> in Table 1 are as follows.
<1> A product name of white-pigment-containing cross-linked acrylic particles (average particle diameter: 6 μm) manufactured by Negami Chemical Industrial Co., Ltd.
<2> A product name of a multi-functional epoxy resin (triglycidyl isocyanurate) manufactured by Nissan Chemical Industries, Ltd.
<3> A product name of phosphinate manufactured by Clariant (Japan) K. K.
<4> A product name of melamine manufactured by Nissan Chemical Industries, Ltd.
<5> A product name of a butadiene defoaming agent manufactured by Kyoeisha Chemical Co., Ltd.
<6> A product name of a compound having a radically polymerizable group in its molecule (EO-modified bisphenol A dimethacrylate) manufactured by Hitachi Chemical Co., Ltd.
<7> A product name of a compound having a radically polymerizable group in its molecule (resin containing a carboxyl group and a photosensitive group) (solid content concentration of 65%, acid number of 98 mgKOH/g based on solid content) manufactured by Nippon Kayaku Co., Ltd
<8> A product name of a photo-polymerization initiator manufactured by BASF Japan Ltd.

<Formation of Coating Film on Polyimide Film>

With the use of a Baker's applicator, the resin compositions for white insulating films were each flow-cast and applied to a 100 mm×100 mm area of a 25-μm thick polyimide film (manufactured by Kaneka Corporation, product name: 25NPI) so that a finally dried film had a thickness of 20 μm. A resultant film was dried at 80° C. for 20 minutes and then exposed to ultraviolet rays having an integrated exposure amount of 300 mJ/cm². Subsequently, the film was developed by spraying a 1.0 weight % sodium carbonate aqueous solution heated to 30° C., at a spraying pressure of 1.0 kgf/mm² for 90 seconds. After the development, the film was rinsed with purified water sufficiently, and then cured by heating in an oven at 150° C. for 30 minutes. In this manner, cured film made from the resin composition for a white insulating film was formed on the polyimide film.

<Evaluation of Cured Film>

The cured film thus prepared was evaluated in regard to the following items. Evaluation results are shown in Table 8.

Note that photosensitivity, a tack property, folding endurance, electrical insulation reliability, solder heat resistance, warpage, and flame retardancy were evaluated by similar methods to those of Examples 7 to 13.

(II) Reflectance

By a method that is the same as the method described in <Formation of Coating Film on Polyimide Film> above, a 20-μm white-insulating-film-laminated film was prepared on a surface of a 25-μm thick polyimide film (APICAL 25NPI manufactured by Kaneka Corporation). By use of the white-insulating-film-laminated film thus obtained, reflectance of the white insulating film was measured by the following method, and a measured value at 450 nm was determined as the reflectance of the white insulating film. It is preferable that the reflectance be not less than 80%.

Apparatus used: visible spectrophotometer V-650 manufactured by JASCO Corporation
Measured wavelength region: 300 nm to 800 nm
Standard white plate: Spectraron™ manufactured by Labsphere, Inc.

TABLE 8

| Evaluation Item | Ex. 20 | Ex. 21 | Ex. 22 | Ex. 23 | Ex. 24 | Ex. 25 | Com. Ex. 9 | Com. Ex. 10 |
|---|---|---|---|---|---|---|---|---|
| Photosensitivity | G | G | G | G | G | G | G | G |
| Tack Property | G | G | G | G | G | G | G | P |
| Folding Endurance (time) | 6 | 6 | 5 | 5 | 5 | 5 | 0 | 0 |
| Electrical Insulation Reliability | | | | | | | | |
| Insulation Resistance Value (Ω) | $4 \times 10^9$ | $5 \times 10^9$ | $4 \times 10^8$ | $1 \times 10^{10}$ | $3 \times 10^9$ | $7 \times 10^9$ | $5 \times 10^9$ | $1 \times 10^{10}$ |
| Appearance Change | G | G | G | G | G | G | G | G |
| Solder Heat Resistance | G | G | G | G | G | G | G | G |
| Warpage (mm) | 1.5 | 2.0 | 1.5 | 2.5 | 3.0 | 2.0 | 8.0 | 20.0 |
| Reflectance (%) | 80 | 80 | 80 | 80 | 80 | 80 | 80 | 80 |
| Flame Retardancy | G | G | G | G | G | G | G | G |

Comparative Example 9

Physical property evaluations were carried out by a method that is the same as the method described in Example 20 by use of polymethacrylate methyl cross-linked polymer particles (manufactured by Ganz Chemical Co., Ltd., trade name GanzPearl GM-0801S, average particle diameter of 8 μm) to which 11.40 parts by weight of rutile type titanium dioxide (manufactured by ISHIHARA SANGYO KAISHA, LTD., trade name TIPAQUE CR-60) was added as the white pigment, instead of (B-2) the white-pigment-containing cross-linked polymer particles which were prepared in Synthesis Example 6 and used in Example 20. Evaluation results are shown in Table 8.

Comparative Example 10

Physical property evaluations were carried out by a method that is the same as the method described in Example 20 by use of 11.40 parts by weight of rutile type titanium dioxide (manufactured by ISHIHARA SANGYO KAISHA, LTD., trade name TIPAQUE CR-60) added as the white pigment instead of (B-2) the white-pigment-containing cross-linked polymer particles which were prepared in Synthesis Example 6 and used in Example 20. Evaluation results are shown in Table 8.

INDUSTRIAL APPLICABILITY

The resin composition for a pigment-containing insulating film of the present invention is widely applicable to industries in electrical and electronic fields. For example, the resin composition for a pigment-containing insulating film of the present invention can be used as an insulating film and/or a protective coating agent on a semiconductor device, a substrate material and/or a surface protecting material for a flexible circuit board, an interlayer insulating film and/or a protective film of a microcircuit, or the like. Needless to say, the resin composition for a pigment-containing insulating film of the present invention is not limited to these.

REFERENCE SIGNS LIST

1 Polyimide film laminated with an insulating film made from a resin composition for a pigment-containing insulating film)
2 Amount of warpage
3 Flat and smooth table

The invention claimed is:

1. A printed wiring board provided with a pigment-containing insulating film comprising a flexible printed wiring board covered with the pigment-containing insulating film obtained from a resin composition, the resin composition comprising at least:
a binder polymer (A) that
is soluble in an organic solvent,
has a urethane bond (a1), and
has at least a functional group that is a carboxyl group (a2) or an imide group (a3);
and
pigment-containing cross-linked polymer particles (B) that are polymer particles having a pigment dispersed therein and whose polymers have a cross-linked structure and a urethane bond;
wherein the polymer particles (B) are electrically insulating.

2. The printed wiring board as set forth in claim 1, wherein
the pigment-containing cross-linked polymer particles (B) are in a range from 1 μm to 20 μm in average particle diameter.

3. The printed wiring board as set forth in claim 1, wherein
an amount of oil absorption of the pigment-containing cross-linked polymer particles (B) is not less than 50 ml/100 g.

4. The printed wiring board as set forth claim 1, wherein
the pigment-containing cross-linked polymer particles (B) are in an amount ranging from 30 parts by weight to 100 parts by weight, with respect to 100 parts by weight of the binder polymer (A).

5. The printed wiring board as set forth in claim 1, further comprising:
a phosphoric flame retardant (F).

6. The printed wiring board as set forth in claim 5, wherein
the phosphoric flame retardant (F) is phosphinate.

7. The printed wiring board as set forth in claim 5, wherein
the phosphoric flame retardant (F) is in an amount ranging from 5 parts by weight to 100 parts by weight, with respect to 100 parts by weight of the binder polymer (A).

8. The printed wiring board as set forth in claim 1, wherein
the insulating film is obtained by applying the resin composition to a surface of a base material, drying, and curing the resin composition.

9. The printed wiring board as set forth in claim 1, further comprising:
a thermosetting resin (C).

10. The printed wiring board as set forth in claim 1, wherein
a compound (D) having a radically polymerizable group in its molecule; and
a photo-polymerization initiator (E).

11. The printed wiring board as set forth in claim 1, wherein the pigment of the cross-linked polymer particles (B) is a black pigment or a white pigment.

12. The printed wiring board as set forth in claim 11, wherein the black pigment is carbon black.

13. A printed wiring board provided with a pigment-containing insulating film comprising a printed wiring board covered with the pigment-containing insulating film obtained from a resin composition, the resin composition comprising at least:
a binder polymer (A) that
is soluble in an organic solvent,
has a urethane bond (a1), and
has at least a functional group that is a carboxyl group (a2) or an imide group (a3);
and
pigment-containing cross-linked polymer particles (B) that are polymer particles having a pigment dispersed therein and whose polymers have a cross-linked structure and a urethane bond;
wherein the polymer particles (B) are electrically insulating.

14. The printed wiring board as set forth in claim 13, wherein
the pigment-containing cross-linked polymer particles (B) are in a range from 1μm to 20 μm in average particle diameter.

15. The printed wiring board as set forth in claim 13, further comprising:
   a phosphoric flame retardant (F).

16. The printed wiring board as set forth in claim 13, wherein
   the insulating film is obtained by applying the resin composition to a surface of a base material drying, and curing the resin composition.

17. The printed wiring board as set forth in claim 13, wherein
   an amount of oil absorption of the pigment-containing cross-linked polymer particles (B) is not less than 50 ml /100 g.

18. The printed wiring board as set forth in claim 13, further comprising:
   a thermosetting resin (C).

19. The printed wiring board as set forth in claim 13, wherein
   a compound (D) having a radically polymerizable group in its molecule; and
   a photo-polymerization initiator (E).

* * * * *